United States Patent
Kuwabara

(10) Patent No.: US 9,666,689 B2
(45) Date of Patent: May 30, 2017

(54) SEMICONDUCTOR DEVICE AND METHOD FOR MANUFACTURING THE SAME

(71) Applicant: SEMICONDUCTOR ENERGY LABORATORY CO., LTD., Atsugi-shi, Kanagawa-ken (JP)

(72) Inventor: Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 63 days.

(21) Appl. No.: 14/696,681

(22) Filed: Apr. 27, 2015

(65) Prior Publication Data

US 2015/0236129 A1  Aug. 20, 2015

Related U.S. Application Data

(63) Continuation of application No. 13/349,744, filed on Jan. 13, 2012, now Pat. No. 9,019,440.

(30) Foreign Application Priority Data

Jan. 21, 2011 (JP) ................................ 2011-011159

(51) Int. Cl.
*G02F 1/1343* (2006.01)
*H01L 29/66* (2006.01)
*G02F 1/1362* (2006.01)

(52) U.S. Cl.
CPC .. *H01L 29/66742* (2013.01); *G02F 1/136286* (2013.01); *G02F 2001/134381* (2013.01)

(58) Field of Classification Search
CPC ........................ G02F 1/1368; G02F 1/136286
See application file for complete search history.

(56) References Cited

U.S. PATENT DOCUMENTS

| | | |
|---|---|---|
| 5,477,355 A | 12/1995 | Sasaki et al. |
| 5,886,761 A | 3/1999 | Sasaki et al. |
| 8,450,144 B2 | 5/2013 | Sakata et al. |
| 8,687,158 B2 | 4/2014 | Choi et al. |
| 2004/0252272 A1 | 12/2004 | Takatori et al. |

(Continued)

FOREIGN PATENT DOCUMENTS

| | | |
|---|---|---|
| EP | 1981085 A | 10/2008 |
| JP | 05-203987 A | 8/1993 |

(Continued)

OTHER PUBLICATIONS

Taiwanese Office Action (Application No. 101101422) Dated Nov. 20, 2015.

*Primary Examiner* — Phu Vu
(74) *Attorney, Agent, or Firm* — Fish & Richardson P.C.

(57) ABSTRACT

An object is to reduce the number of photomasks used for manufacturing a transistor and manufacturing a display device to less than the conventional one. The display device is manufactured through, in total, three photolithography steps including one photolithography step which serves as both a step of forming a gate electrode and a step of forming an island-like semiconductor layer, one photolithography step of forming a contact hole after a planarization insulating layer is formed, and one photolithography step which serves as both a step of forming a source electrode and a drain electrode and a step of forming a pixel electrode.

16 Claims, 13 Drawing Sheets

(56) References Cited

U.S. PATENT DOCUMENTS

| | | | |
|---|---|---|---|
| 2006/0258034 A1* | 11/2006 | Sohn | H01L 29/41733 438/30 |
| 2007/0145436 A1 | 6/2007 | Lin | |
| 2008/0030639 A1* | 2/2008 | Qiu et al. | 349/46 |
| 2008/0308795 A1* | 12/2008 | Lee | H01L 29/7869 257/43 |
| 2009/0001374 A1 | 1/2009 | Inoue et al. | |
| 2009/0090912 A1 | 4/2009 | Chen | |
| 2009/0108264 A1 | 4/2009 | Inoue et al. | |
| 2010/0032664 A1 | 2/2010 | Lee et al. | |
| 2011/0019144 A1* | 1/2011 | Koh | G02F 1/134363 349/143 |
| 2011/0024740 A1 | 2/2011 | Yamazaki et al. | |
| 2011/0024750 A1 | 2/2011 | Yamazaki et al. | |
| 2011/0024751 A1 | 2/2011 | Yamazaki et al. | |
| 2011/0031491 A1 | 2/2011 | Yamazaki et al. | |
| 2011/0037068 A1 | 2/2011 | Yamazaki et al. | |

FOREIGN PATENT DOCUMENTS

| | | |
|---|---|---|
| JP | 2000-091582 A | 3/2000 |
| JP | 2002-341355 A | 11/2002 |
| JP | 2003-179069 A | 6/2003 |
| JP | 2007-227440 A | 9/2007 |
| JP | 2007-235102 A | 9/2007 |
| JP | 2007-258675 A | 10/2007 |
| JP | 2009-111201 A | 5/2009 |
| TW | 200725896 | 7/2007 |
| TW | 200801752 | 1/2008 |
| TW | 201044585 | 12/2010 |

* cited by examiner

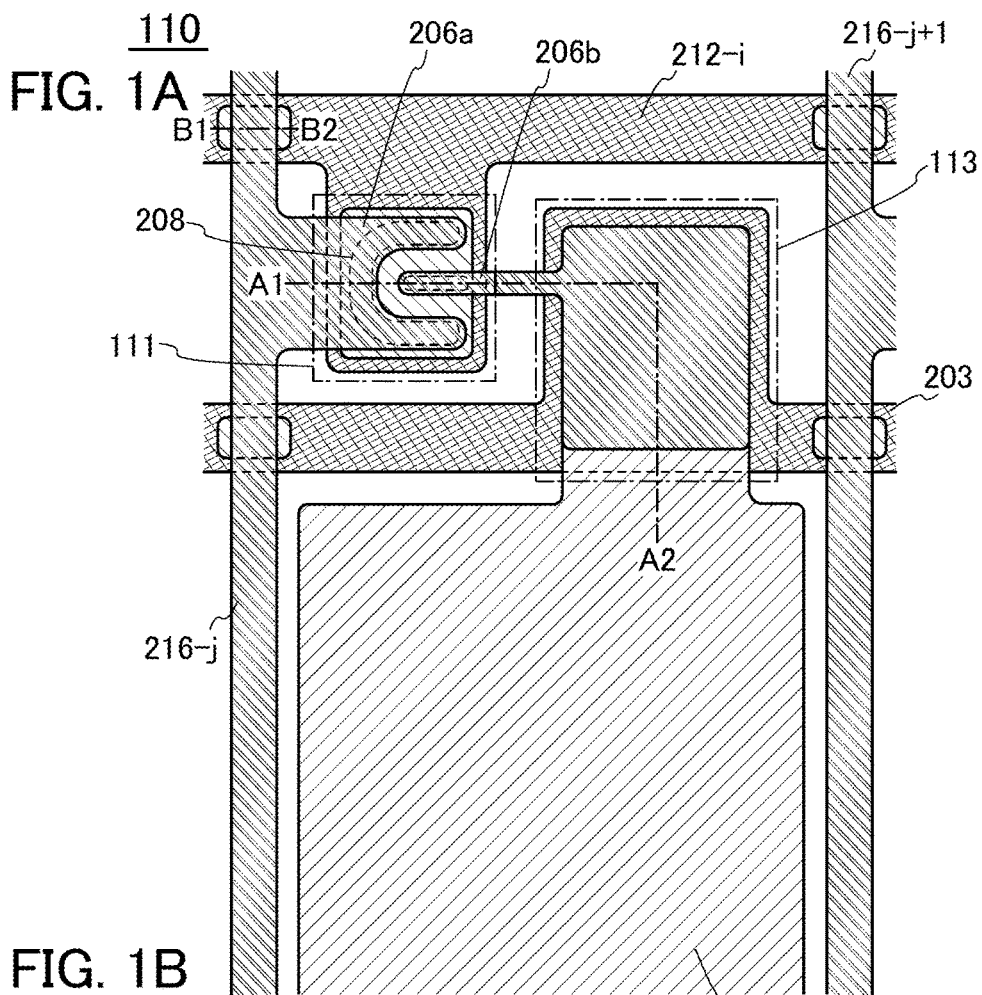
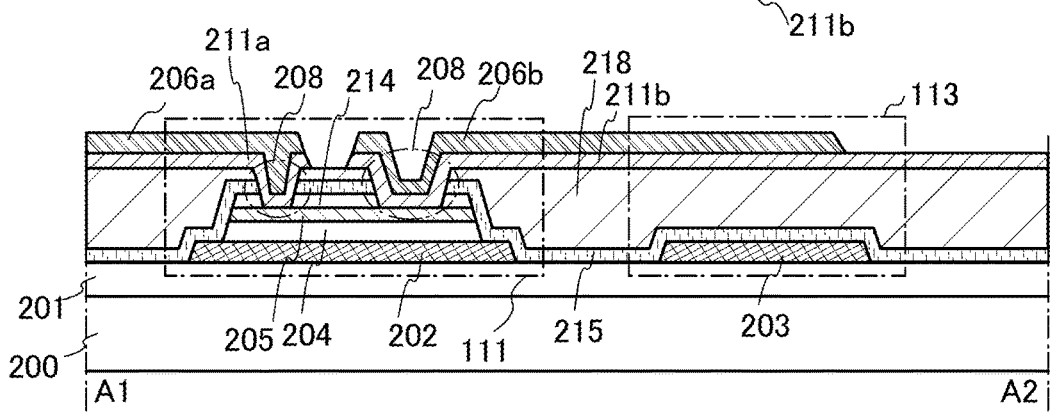

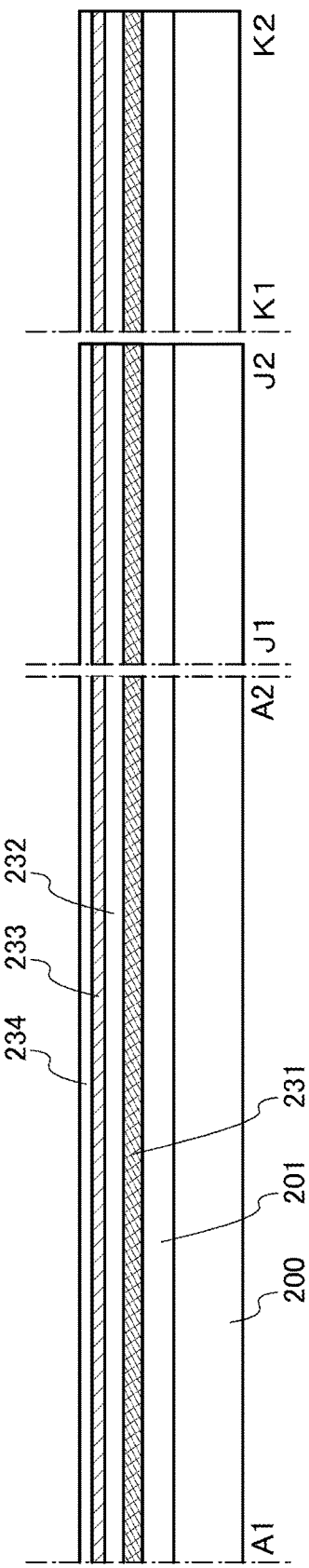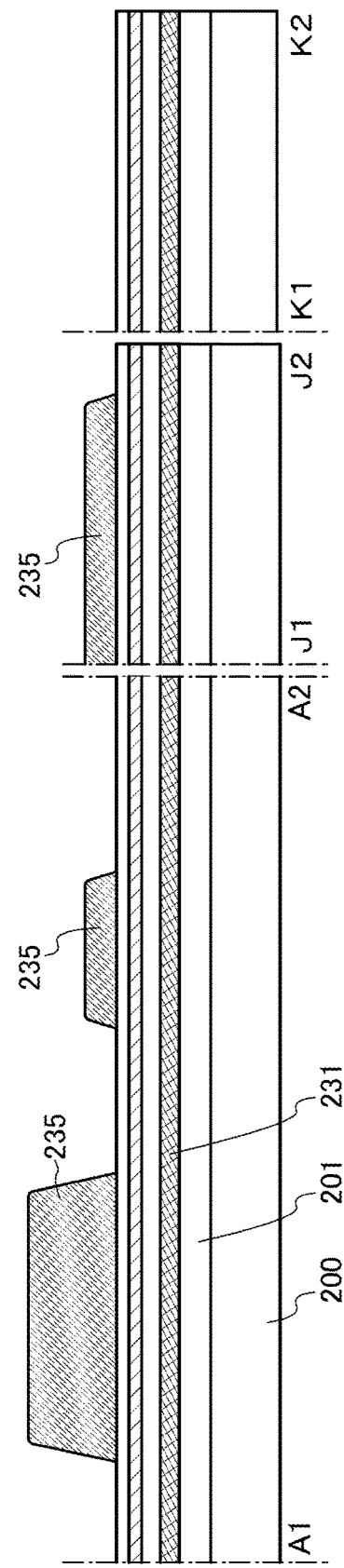

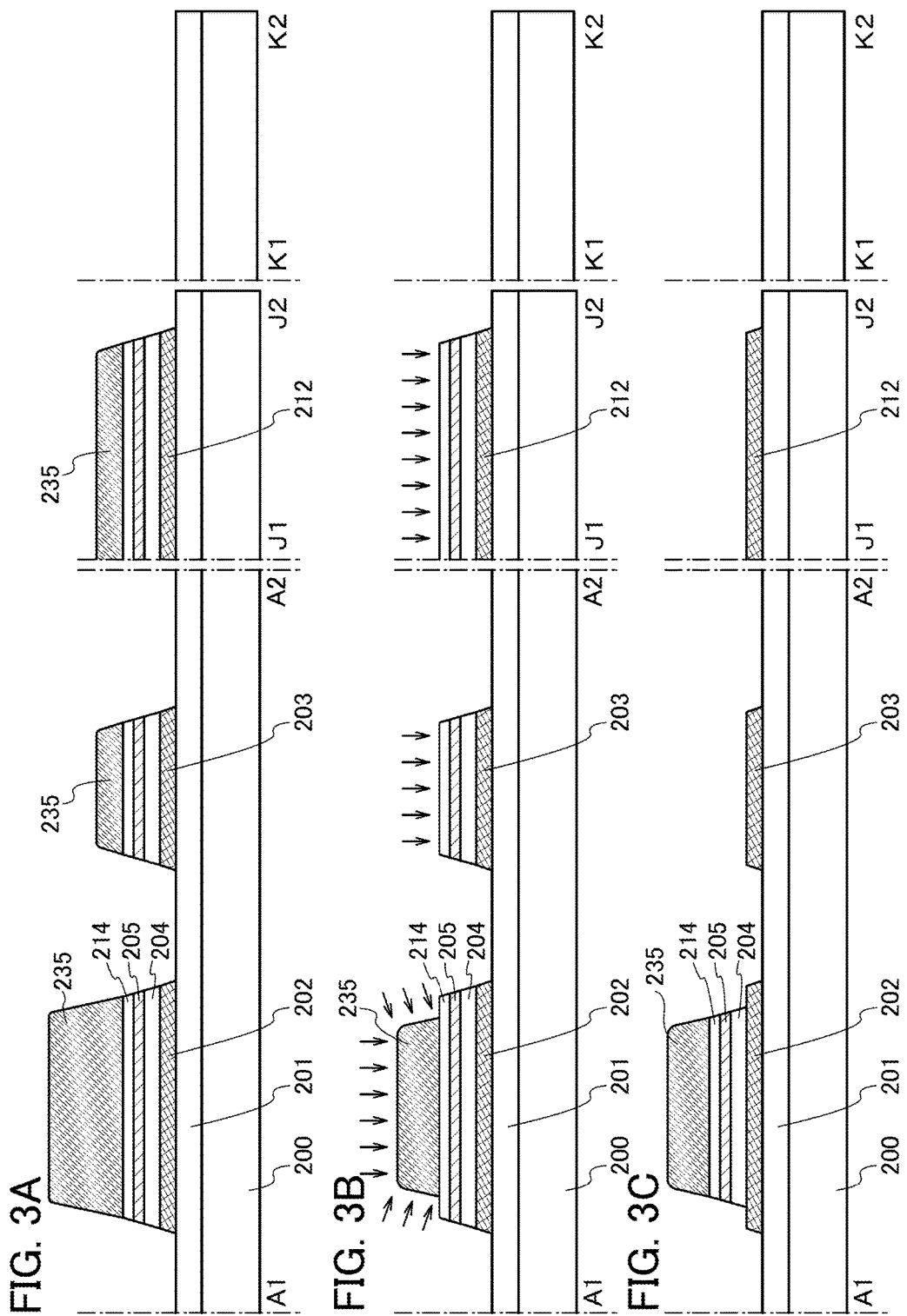

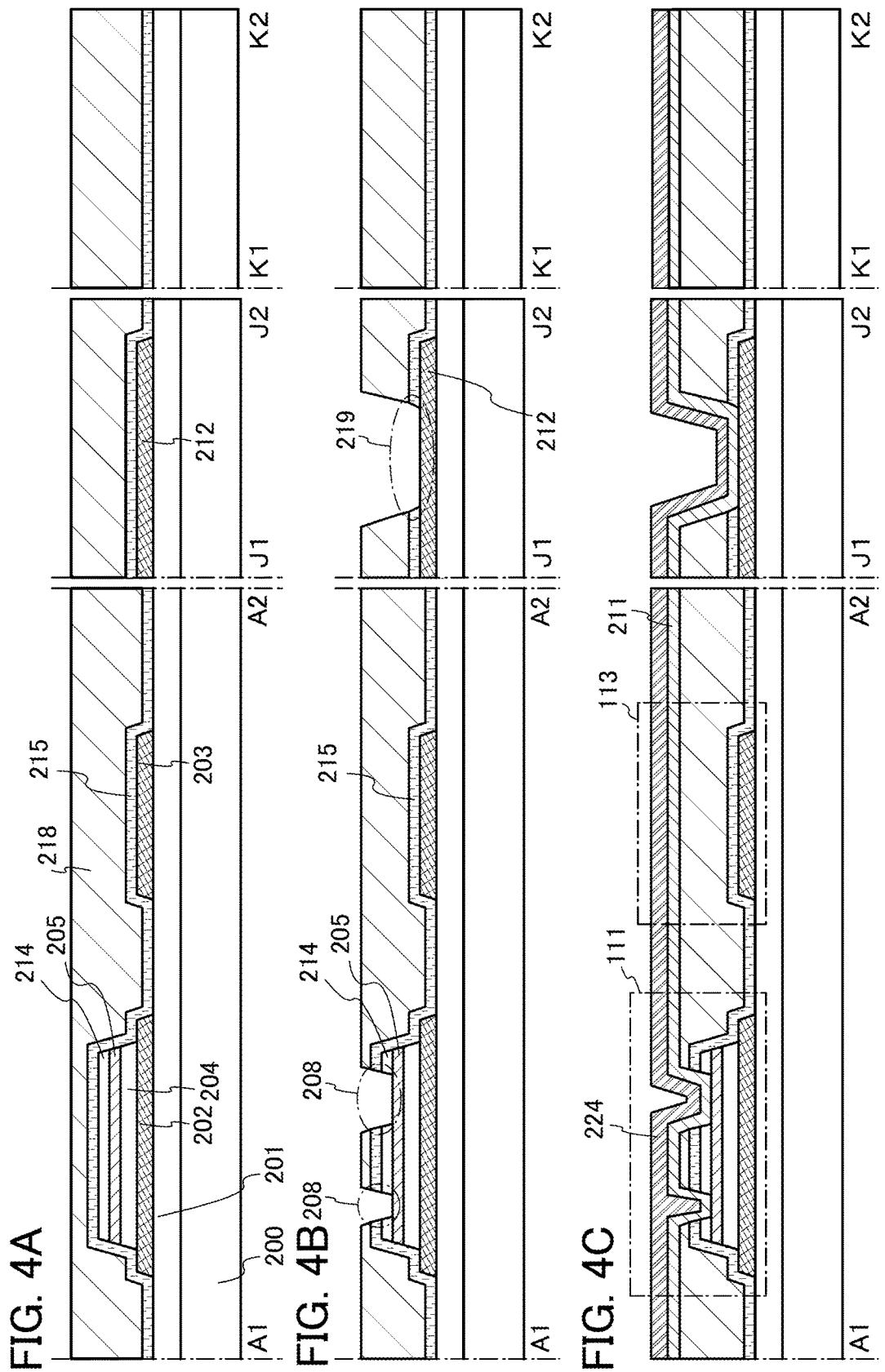

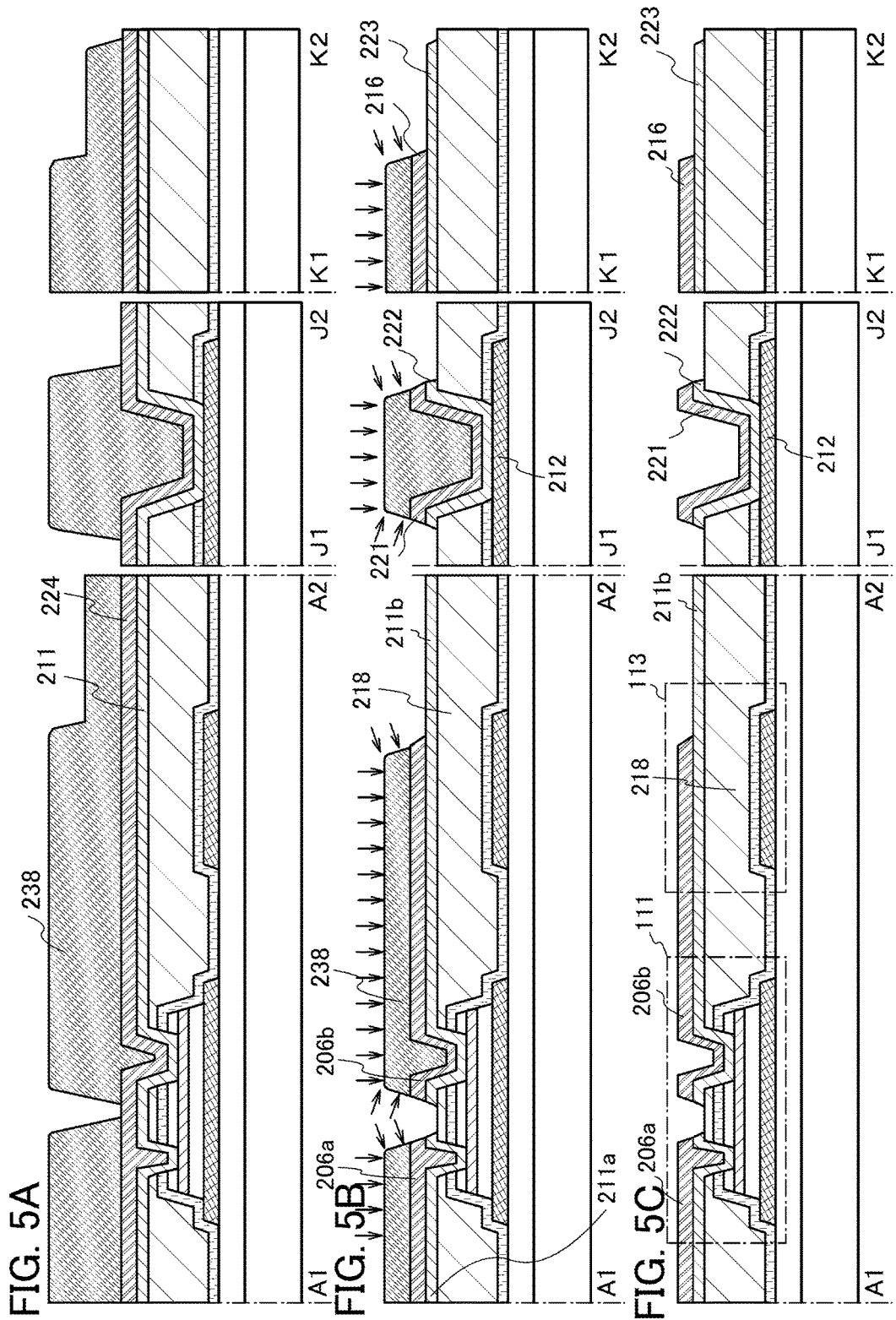

FIG. 7A1
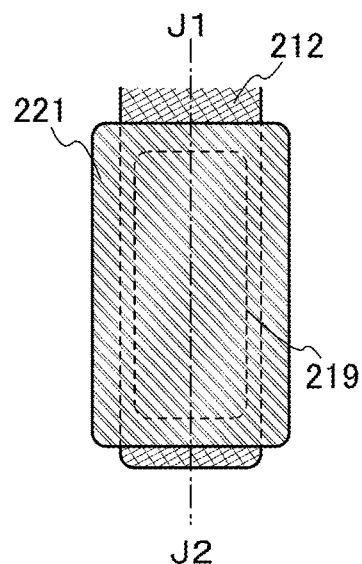
FIG. 7A2
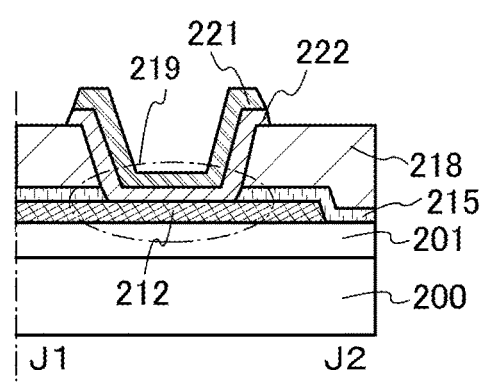
FIG. 7B1
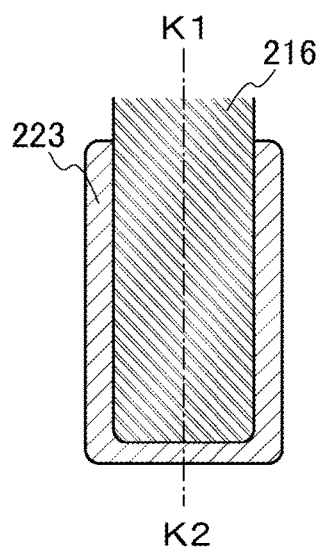
FIG. 7B2
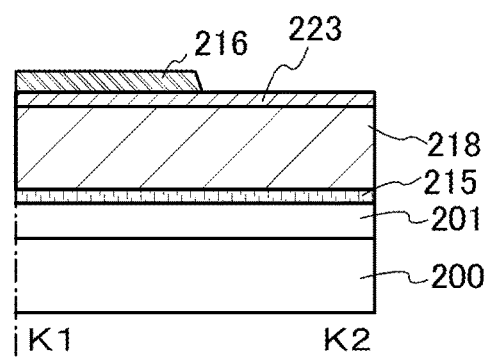

SEMICONDUCTOR DEVICE AND METHOD FOR MANUFACTURING THE SAME

CROSS-REFERENCE TO RELATED APPLICATIONS

This application is a continuation of U.S. application Ser. No. 13/349,744, filed Jan. 13, 2012, now allowed, which claims the benefit of a foreign priority application filed in Japan as Serial No. 2011-011159 on Jan. 21, 2011, both of which are incorporated by reference.

BACKGROUND OF THE INVENTION

1. Field of the Invention

The present invention relates to a semiconductor device and a method for manufacturing the semiconductor device.

In this specification, a semiconductor device means all types of devices which can function by utilizing semiconductor characteristics, and an electro-optical device, a semiconductor circuit, and an electronic appliance are all semiconductor devices.

2. Description of the Related Art

In recent years, transistors that are formed using a semiconductor thin film having a thickness of several nanometers to several hundreds of nanometers over a substrate having an insulating surface such as a glass substrate have been attracting attentions. Transistors are widely used for electronic devices such as integrated circuits (ICs) and electro-optical devices. In particular, transistors are urgently developed as switching elements of display devices typified by liquid crystal display devices, EL display devices, electronic paper, and the like.

In an active matrix liquid crystal display device, a voltage is applied between a pixel electrode connected to a selected switching element and a counter electrode corresponding to the pixel electrode, and thus, a liquid crystal layer disposed between the pixel electrode and the counter electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

In an active matrix EL display device, where a plurality of switching elements is disposed in a pixel, voltage is applied to a light-emitting element electrically connected to at least one of the switching elements, whereby electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, the light-emitting element is called a current-excitation light-emitting element.

The range of uses of such an active matrix display device is expanding, and demands for larger screen size, higher definition, and higher aperture ratio are increasing. In addition, it is demanded that a production method of the active matrix display device offer high fabrication yield and reduce production cost. Simplification of a process is one way for increasing productivity and reducing manufacturing cost.

In active matrix display devices, transistors are mainly used as switching elements. In manufacturing transistors, reduction in the number of photolithography steps or simplification of the photolithography step is important for simplification of the whole process. For example, when one photolithography step is added, the following steps are further needed: resist application, prebaking, light exposure, development, post-baking, and the like and, moreover, steps before and after the aforementioned steps, such as film formation, etching, resist removal, and cleaning and drying a substrate. The number of steps is significantly increased only by adding one photolithography step in the manufacturing process. Therefore, many techniques for reducing the number of photolithography steps or simplifying the photolithography step in a manufacturing process have been developed.

Transistors are broadly classified into top-gate transistors, in which a channel formation region is provided below a gate electrode, and bottom-gate transistors, in which a channel formation region is provided above a gate electrode. These transistors are generally manufactured using at least five photomasks. Further, when a spacer for keeping a space between a pair of substrates is formed through a photolithography step in order to hold a liquid crystal layer between the pair of substrates, a liquid crystal display device is manufactured with six or more photomasks in total.

Many conventional techniques for simplifying the photolithography step use a complicated technique such as backside light exposure (e.g., Patent Document 1), resist reflow, or a lift-off method, which requires a special apparatus in many cases. Using such complicated techniques may cause various problems, thereby leading to reduction in yield.

REFERENCE

[Patent Document 1] Japanese Published Patent Application No. H05-203987

SUMMARY OF THE INVENTION

An object of one embodiment of the present invention is to reduce the number of photolithography steps used for manufacturing a transistor and a display device to less than the conventional one.

Another object of one embodiment of the present invention is to reduce the number of photomasks used for manufacturing a transistor and manufacturing a display device to less than the conventional one.

Another object of one embodiment of the present invention is to provide a display device with low power consumption.

A step of forming a gate electrode (including another electrode or a wiring which is formed in the same layer) and a step of forming an island-like semiconductor layer are performed through one photolithography step, whereby a semiconductor device can be manufactured with the number of photomasks and the number of photolithography steps reduced to less than the conventional one.

A semiconductor device is manufactured through, in total, three photolithography steps including one photolithography step which serves as both a step of forming a gate electrode (including another electrode or a wiring which is formed in the same layer) and a step of forming an island-like semiconductor layer, one photolithography step of forming a contact hole after a planarization insulating layer is formed, and one photolithography step which serves as both a step of forming a source electrode and a drain electrode (including another electrode or a wiring which is formed in the same layer) and a step of forming a pixel electrode (including another electrode or a wiring which is formed in the same layer). Note that a photolithography step refers to a step in which a resist formed over a film is exposed to light through a photomask and development is performed to form a resist mask, and then the film is etched using the resist mask. That is, one photomask is used in one photolithography step.

A conductive layer to be a gate electrode, an insulating layer to be a gate insulating layer, a semiconductor layer, and an insulating layer to be a channel protective layer, which are each included in a transistor, are successively formed, and a resist mask having a large thickness and a small thickness, which is exposed to light and developed using a multi-tone mask as a first photomask, is formed.

The conductive layer to be a gate electrode, the insulating layer to be a gate insulating layer, the semiconductor layer, and the insulating layer to be a channel protective layer are etched using the resist mask as a mask. Subsequently, the resist mask having a small thickness is removed so that a remaining conductive layer to be a gate electrode, a remaining insulating layer to be a gate insulating layer, a remaining semiconductor layer, and a remaining insulating layer to be a channel protective layer are exposed. Further, the insulating layer to be a gate insulating layer, the semiconductor layer, and the insulating layer to be a channel protective layer are etched using the remaining resist mask as a mask so that a gate electrode (including another electrode or a wiring which is formed in the same layer), an island-like gate insulating layer, an island-like semiconductor layer, and an island-like channel protective layer are formed. After that, the resist mask is removed.

In such a manner, the gate electrode (including another electrode or a wiring which is formed in the same layer) and the island-like semiconductor layer can be formed through one photolithography step. At this time, the side surfaces of the island-like gate insulating layer, the island-like semiconductor layer, and the island-like channel protective layer on each side are substantially aligned with one another, and each layer has a substantially similar shape when seen from the above.

In this specification, "layers in which the side surfaces on one side are substantially aligned with one another" means that outlines of the side surfaces of the layers on one side are substantially aligned as seen from the above, including the case where upper end portions and lower end portions of the layers are aligned, the case where the side surface of one layer is recessed with respect to the side surface of another layer, and the case where tapered shapes of the side surfaces on each side of the layers are different from one another.

Further, the end portions of the gate electrode are projected outside the end portions of the island-like gate insulating layer, the island-like semiconductor layer, and the island-like channel protective layer, whereby a step is suppressed and coverage with an insulating layer or a conductive layer which will be formed later can be improved.

Then, a planarization insulating film is formed, and a contact hole is formed through a photolithography step using a second photomask. After that, a first conductive layer to be a pixel electrode and a second conductive layer to be a source electrode or a drain electrode are successively formed, and a resist mask having a large thickness and a small thickness, which is exposed to light and developed using a multi-tone mask as a third photomask, is formed.

The first conductive layer to be a pixel electrode and the second conductive layer to be a source electrode or a drain electrode are etched using the resist mask as a mask. Subsequently, part of the resist mask is removed and the second conductive layer is exposed. The second conductive layer to be a source electrode or a drain electrode is etched using the remaining resist mask as a mask to form a source electrode or a drain electrode (including another electrode or a wiring which is formed in the same layer), and the first conductive layer to be a pixel electrode is exposed. After that, the resist mask which remains in contact with the top surface of the source electrode or the drain electrode is removed. As a result, a transistor can be manufactured using three photomasks.

After that, when a spacer for keeping a space between a pair of substrates is formed through a photolithography step, a liquid crystal display device can be manufactured with four photomasks in total.

Further, when the resist mask is not removed and used as a spacer for keeping a space between a pair of substrates, a liquid crystal display device can be manufactured with three photomasks in total. Alternatively, in the case of using a spherical spacer as the spacer, a liquid crystal display device can be manufactured with three photomasks.

A pixel electrode and a counter electrode may be provided only on one of the substrates instead of providing the counter electrode on a counter substrate so that a liquid crystal display device in a horizontal electrical field mode (an IPS method or an FFS method) can be manufactured. With the steps disclosed in this specification, a pixel electrode and a counter electrode can be provided only on one of the substrates without an increase in the number of masks; therefore, a liquid crystal display device can be manufactured with three photomasks in total. When a pixel electrode and a counter electrode are provided only on one of the substrates, a structure without a conductive spacer for making conduction with a counter electrode of a counter substrate can be employed. In the case of providing a conductive spacer, it is necessary that a counter electrode of a counter substrate and an electrode pad for taking a fixed potential, which is formed over a substrate provided with a transistor, be precisely aligned with each other to make conduction, and this might lead a decrease in yield. When a pixel electrode and a counter electrode are provided only on one of the substrates, the alignment of a counter substrate does not need to be performed so precisely.

In addition, in a display device, a protective circuit for protecting a transistor and the like in a pixel is preferably formed over the same substrate. With the steps disclosed in this specification, a protective diode in which a drain electrode and a gate electrode of a transistor are electrically connected to each other can be formed without an increase in the number of masks. The reliability of the display device can be improved by forming the protective diode.

Further, in a display device, a driver circuit for driving a transistor in a pixel can be formed over the same substrate. With the steps disclosed in this specification, a driver circuit in which a drain electrode and a gate electrode of a transistor are electrically connected to each other can be formed without an increase in the number of masks.

In manufacturing an EL display device, a plurality of transistors is provided in one pixel, and, for example, a contact is formed in a manner such that a source electrode or a drain electrode of one transistor is electrically connected to a gate electrode of another transistor in order to connect the plurality of transistors to one another other.

With the steps disclosed in this specification, the contacts can be formed without an increase in the number of masks; therefore, a plurality of transistors in which a gate electrode of one transistor and a drain electrode of another transistor are connected to each other can be manufactured with three photomasks. Then, a partition wall for insulating adjacent pixel electrodes is formed with one photomask; therefore, an EL display device can be manufactured with four photomasks in total.

According to one embodiment of the present invention, a semiconductor device includes a gate electrode, an island-like semiconductor layer, a source electrode, a drain electrode, a wiring, and a pixel electrode. In the semiconductor device, the source electrode and the drain electrode are electrically connected to the island-like semiconductor layer through contact holes; the source electrode or the drain electrode is electrically connected to a pixel electrode; the gate electrode, the island-like semiconductor layer, and the wiring are formed with one photomask; and the source electrode, the drain electrode, and the pixel electrode are formed with another photomask.

According to another embodiment of the present invention, a semiconductor device includes a first island-like insulating layer in contact with a gate electrode; an island-like semiconductor layer in contact with the first island-like insulating layer; a second island-like insulating layer in contact with the island-like semiconductor layer; a third insulating layer which is in contact with the second island-like insulating layer and covers side surfaces of the island-like semiconductor layer; a planarization insulating layer in contact with the third insulating layer; a source electrode and a drain electrode electrically connected to the island-like semiconductor layer through a contact hole formed in the second island-like insulating layer, the third insulating layer, and the planarization insulating layer; a pixel electrode electrically connected to the source electrode or the drain electrode; and a wiring. In the semiconductor device, the gate electrode, the first island-like insulating layer, the island-like semiconductor layer, the second island-like insulating layer, and the wiring are formed with one photomask; and the source electrode, the drain electrode, and the pixel electrode are formed with another photomask.

According to another embodiment of the present invention, a semiconductor device includes a plurality of pixels, a plurality of signal lines, and a plurality of scan lines. In the semiconductor device, the plurality of pixels each includes a transistor, a capacitor, and a liquid crystal element. The transistor, which has a switching function, includes a gate electrode, an island-like semiconductor layer, a source electrode, a drain electrode, a wiring, and a pixel electrode. In the transistor, the source electrode and the drain electrode are electrically connected to the island-like semiconductor layer through a contact hole; and the pixel electrode is electrically connected to the source electrode or the drain electrode, and the liquid crystal element. A portion of the capacitor where the wiring and the pixel electrode are overlapped with each other functions as a storage capacitor. The gate electrode, the island-like semiconductor layer, and the wiring are formed with one photomask; and the source electrode, the drain electrode, and the pixel electrode are formed with another photomask.

According to another embodiment of the present invention, a semiconductor device includes a plurality of pixels, a plurality of signal lines, and a plurality of scan lines. In the semiconductor device, the plurality of pixels each includes a transistor, a capacitor, and a liquid crystal element. The transistor, which has a switching function, includes a first island-like insulating layer in contact with a gate electrode; an island-like semiconductor layer in contact with the first island-like insulating layer; a second island-like insulating layer in contact with the island-like semiconductor layer; a third insulating layer which is in contact with the second island-like insulating layer and covers side surfaces of the island-like semiconductor layer; a planarization insulating layer in contact with the third insulating layer; a source electrode and a drain electrode electrically connected to the island-like semiconductor layer through a contact hole formed in the second island-like insulating layer, the third insulating layer, and the planarization insulating layer; and a pixel electrode electrically connected to the source electrode and the drain electrode, and the liquid crystal element. The capacitor includes a wiring, the pixel electrode, a dielectric layer formed with the third insulating layer and the planarization insulating layer. In the capacitor, a portion where the wiring and the pixel electrode are overlapped with each other with the dielectric layer provided therebetween functions as a storage capacitor. The gate electrode, the first island-like insulating layer, the island-like semiconductor layer, the second island-like insulating layer, and the wiring are formed with one photomask; and the source electrode, the drain electrode, and the pixel electrode are formed with another photomask.

According to another embodiment of the present invention, a semiconductor device includes a plurality of pixels, a plurality of signal lines, and a plurality of scan lines. In the semiconductor device, the plurality of pixels each includes a transistor, a capacitor, and a liquid crystal element. The transistor, which has a switching function, includes a gate electrode, an island-like semiconductor layer, a source electrode, a drain electrode, a wiring, a pixel electrode, and a common electrode. In the transistor, the source electrode and the drain electrode are electrically connected to the island-like semiconductor layer through a contact hole; the pixel electrode is electrically connected to the source electrode or the drain electrode, and the liquid crystal element; and the common electrode is electrically connected to the liquid crystal element. A portion of the capacitor where the wiring and the pixel electrode are overlapped with each other functions as a storage capacitor. The gate electrode, the island-like semiconductor layer, and the wiring are formed with one photomask; and the source electrode, the drain electrode, the pixel electrode, and the common electrode are formed with another photomask.

Further, according to one embodiment of the present invention, the top surface of the pixel electrode may be comb-shaped.

According to another embodiment of the present invention, a semiconductor device includes a plurality of pixels, a plurality of signal lines, and a plurality of scan lines. In the semiconductor device, the plurality of pixels each includes a plurality of transistors, a capacitor, and a light-emitting element. At least one of the plurality of transistors has a function of supplying driving current to the light-emitting element, and at least another one of the plurality of transistors has a switching function, which each include a gate electrode, an island-like semiconductor layer, a source electrode, a drain electrode, a wiring, and a pixel electrode. The source electrode and the drain electrode are electrically connected to the island-like semiconductor layer through a contact hole; and the pixel electrode is electrically connected to the source electrode or the drain electrode, and the light-emitting element. A portion of the capacitor where the wiring and the electrode are overlapped with each other functions as a storage capacitor. The gate electrode, the island-like semiconductor layer, and the wiring are formed with one photomask; and the source electrode, the drain electrode, and the pixel electrode are formed with another photomask.

According to another embodiment of the present invention, a semiconductor device includes a plurality of pixels, a plurality of signal lines, and a plurality of scan lines. In the semiconductor device, the plurality of pixels each includes a plurality of transistors, a capacitor, and a light-emitting element. At least one of the plurality of transistors has a function of supplying driving current to the light-emitting element, and at least another one of the plurality of transistors has a switching function, which each include a first island-like insulating layer in contact with a gate electrode; an island-like semiconductor layer in contact with the first island-like insulating layer; a second island-like insulating layer in contact with the island-like semiconductor layer; a third insulating layer which is in contact with the second island-like insulating layer and covers side surfaces of the island-like semiconductor layer; a planarization insulating layer in contact with the third insulating layer; a source electrode and a drain electrode electrically connected to the island-like semiconductor layer through a contact hole formed in the second island-like insulating layer, the third insulating layer, and the planarization insulating layer; and a pixel electrode electrically connected to the source electrode and the drain electrode, and the light-emitting element. The capacitor includes a wiring, an electrode, a dielectric layer formed with the first island-like insulating layer. In the capacitor, a portion where the wiring and the electrode are overlapped with each other with the dielectric layer provided therebetween functions as a storage capacitor. The gate electrode, the first island-like insulating layer, the island-like semiconductor layer, the second island-like insulating layer, and the wiring are formed with one photomask; and the source electrode, the drain electrode, and the pixel electrode are formed with another photomask.

Further, according to another embodiment of the present invention, a multi-tone mask can be used as the photomask.

According to another embodiment of the present invention, a method for manufacturing a semiconductor device includes the steps of forming a gate electrode, an island-like semiconductor layer, and a wiring through a first photolithography step using a first photomask; forming a contact hole through a second photolithography step using a second photomask; and forming a source electrode, a drain electrode, and a pixel electrode through a third photolithography step using a third photomask.

According to another embodiment of the present invention, a method for manufacturing a semiconductor device includes the steps of: forming a first conductive layer, a first insulating layer, a semiconductor layer, and a second insulating layer by successive deposition; selectively etching the first conductive layer, the first insulating layer, the semiconductor layer, and the second insulating layer through a first photolithography step using a first photomask; forming a gate electrode, a first island-like insulating layer, an island-like semiconductor layer, a second island-like insulating layer, and a wiring; forming a third insulating layer and a planarization insulating layer by successive deposition; forming a contact hole by selective etching of the second island-like insulating layer, the third insulating layer, and the planarization insulating layer through a second photolithography step using a second photomask; forming a second conductive layer and a third conductive layer by successive deposition; selectively etching the second conductive layer and the third conductive layer through a third photolithography step using a third photomask; and forming a source electrode, a drain electrode, and a pixel electrode electrically connected to one of the source electrode and the drain electrode.

According to another embodiment of the present invention, a method for manufacturing a semiconductor device includes the steps of: forming a gate electrode, an island-like semiconductor layer, and a wiring through a first photolithography step using a first photomask; forming a contact hole through a second photolithography step using a second photomask; and forming a source electrode, a drain electrode, a pixel electrode, and a common electrode through a third photolithography step using a third photomask.

Further, according to another embodiment of the present invention, a multi-tone mask can be used as the first photomask and the third photomask.

The removal of the conductive layer, the first insulating layer, the semiconductor layer, the second insulating layer, and the third insulating layer can be performed by dry etching, wet etching, or a combination of dry etching and wet etching.

When the gate electrodes, the source electrodes, the drain electrodes, or a wiring connected to such electrodes are formed of a material containing copper or aluminum, wiring resistance can be reduced and thus signal delay can be prevented.

For the semiconductor layer, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide.

Alternatively, an oxide semiconductor can be used for the semiconductor layer. The electron affinity of an oxide semiconductor is higher than that of silicon or germanium, and an ohmic contact between the semiconductor layer, and the source electrode or the drain electrode can be obtained without an ohmic contact layer therebetween. With the use of an oxide semiconductor for the semiconductor layer, a manufacturing process of a semiconductor device can be simplified; thus, the productivity of the semiconductor device can be improved.

Note that an oxide semiconductor which is purified (purified OS) by supply of oxygen after reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor). Accordingly, a transistor including the oxide semiconductor in a semiconductor layer where a channel is formed has characteristics of very small off-state current.

According to one embodiment of the present invention, the number of manufacturing steps of a display device can be reduced; accordingly, a display device can be provided at low cost with high productivity.

Further, a display device can be provided at low cost with high reliability.

BRIEF DESCRIPTION OF THE DRAWINGS

FIGS. 1A to 1C are a top view and cross-sectional views illustrating one embodiment of the present invention.

FIGS. 2A and 2B are cross-sectional views illustrating one embodiment of the present invention.

FIGS. 3A to 3C are cross-sectional views illustrating one embodiment of the present invention.

FIGS. 4A to 4C are cross-sectional views illustrating one embodiment of the present invention.

FIGS. 5A to 5C are cross-sectional views illustrating one embodiment of the present invention.

FIGS. 7A1 and 7B1 and FIGS. 7A2 and 7B2 are top views and cross-sectional views, respectively, illustrating one embodiment of the present invention.

DETAILED DESCRIPTION OF THE INVENTION

Embodiments will be described below in detail with reference to the drawings. Note that the present invention is not limited to the following description, and it will be readily appreciated by those skilled in the art that the mode and details can be changed in various different ways. Therefore, the present invention should not be construed as being limited to the following description of the embodiments.

A transistor is one kind of semiconductor elements and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor might interchange when a transistor of opposite polarity is used or the direction of current flow is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and the "wiring" can be used as part of the "electrode". Further, the term "electrode" or "wiring" can also mean a combination of a plurality of "electrodes" and "wirings" formed in an integrated manner.

[Embodiment 1]

In this embodiment, an example of a semiconductor device manufactured by a smaller number of photomasks and photolithography steps, which is used for a liquid crystal display device; a configuration example of a pixel; and an example of a method for manufacturing a pixel will be described with reference to FIGS. 1A to 1C, FIGS. 2A and 2B, FIGS. 3A to 3C, FIGS. 4A to 4C, FIGS. 5A to 5C, FIGS. 6A and 6B, and FIGS. 7A1, 7A2, 7B1, and 7B2.

Figure 6A:
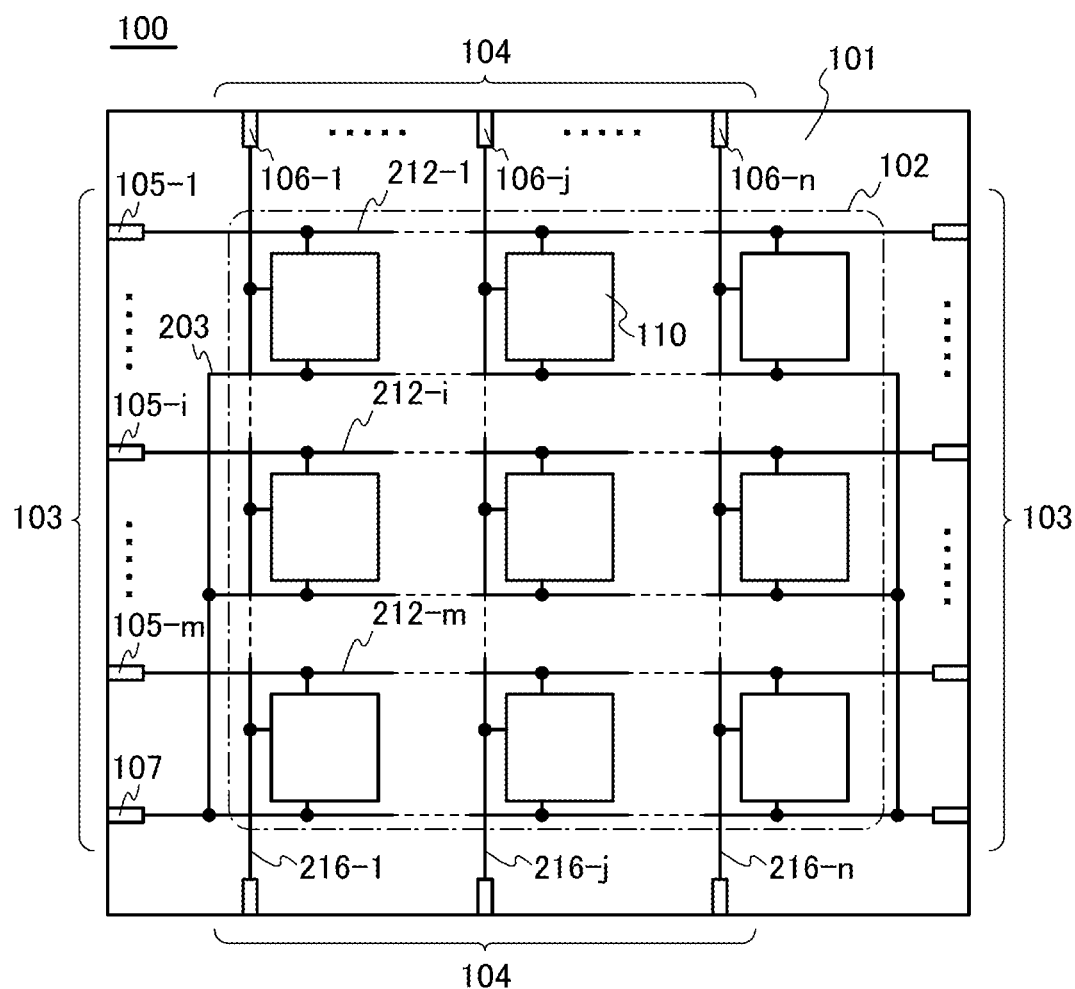
FIGS. 6A and 6B are circuit diagrams illustrating one embodiment of the present invention.

A semiconductor device that is used for a liquid crystal display device will be described with reference to FIGS. 6A and 6B. FIG. 6A illustrates a configuration example of a semiconductor device 100 that is used for a liquid crystal display device. The semiconductor device 100 includes a pixel region 102, a terminal portion 103 including m terminals 105 (105-1 to 105-m and m is an integer of greater than or equal to 1) and a terminal 107, and a terminal portion 104 including n terminals 106 (106-1 to 106-n and n is an integer of greater than or equal to 1) over a substrate 101. Further, the semiconductor device 100 includes m wirings 212 electrically connected to the terminal portion 103, n wirings 216 electrically connected to the terminal portion 104, and a wiring 203. The pixel region 102 includes a plurality of pixels 110 arranged in matrix of m rows (in the longitudinal direction)×n columns (in the transverse direction). The pixel 110 (i,j) (i is an integer greater than or equal to 1 and less than or equal to m, and j is an integer greater than or equal to 1 and less than or equal to n) in the i-th row and the j-th column is electrically connected to a wiring 212-i and a wiring 216-j. In addition, each pixel is connected to the wiring 203 functioning as a capacitor electrode or a capacitor wiring, and the wiring 203 is electrically connected to the terminal 107. The wiring 212-i is electrically connected to a terminal 105-i, and the wiring 216-j is electrically connected to a terminal 106-j.

The terminal portion 103 and the terminal portion 104 are external input terminals and are connected to external control circuits with flexible printed circuits (FPC) or the like. Signals supplied from the external control circuits are input to the semiconductor device 100 through the terminal portion 103 and the terminal portion 104. In FIG. 6A, such terminal portions 103 are provided on the right and left of the pixel region 102, so that signals are input from two directions. Further, such terminal portions 104 are provided above and below the pixel region 102, so that signals are input from two directions. By inputting signals from two directions, signal supply capability is increased and high-speed operation of the semiconductor device 100 is facilitated. In addition, influences of signal delay due to an increase in size of the semiconductor device 100 or an increase in wiring resistance accompanied by an increase in definition can be reduced. Moreover, the semiconductor device 100 can have redundancy, so that the reliability of the semiconductor device 100 can be improved. Although two terminal portions 103 and two terminal portions 104 are provided in FIG. 6A, a structure in which one terminal portion 103 and one terminal portion 104 are provided may also be employed.

Figure 6B:
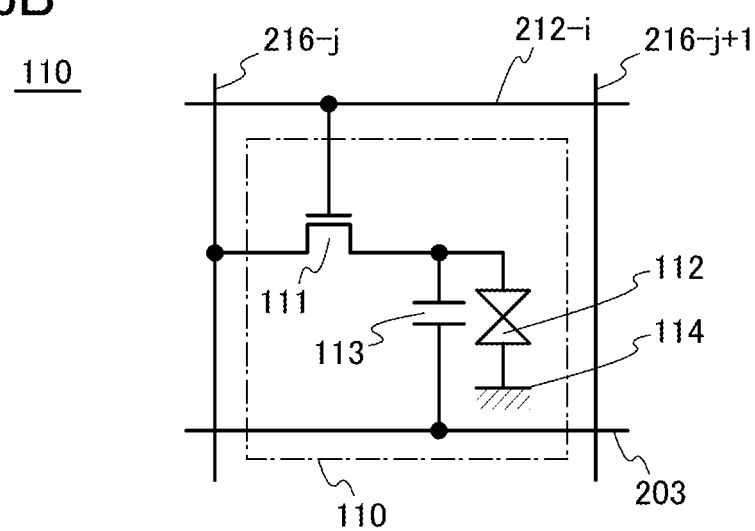

FIG. 6B illustrates a configuration example of the pixel 110 used in the semiconductor device 100. The pixel 110 includes a transistor 111, a liquid crystal element 112, and a capacitor 113. A gate electrode of the transistor 111 is electrically connected to the wiring 212-i, and one of a source electrode and a drain electrode of the transistor 111 is electrically connected to the wiring 216-j. The other of the source electrode and the drain electrode of the transistor 111 is electrically connected to one electrode of the liquid crystal element 112 and one electrode of the capacitor 113. The other electrode of the liquid crystal element 112 is electrically connected to an electrode 114. The potential of the electrode 114 may be a fixed potential such as 0 V, GND, or a common potential. The other electrode of the capacitor 113 is electrically connected to the wiring 203.

The transistor 111 functions as a switching element. The capacitor 113 functions as a storage capacitor. The capacitor 113 need not necessarily be provided; however, in the case of providing the capacitor 113, variation in the potential applied to the liquid crystal element 112, which is caused by a current flowing between the source electrode and the drain electrode in an off state of the transistor 111 (off-state current), can be suppressed.

For a semiconductor layer where a channel of the transistor 111 is formed, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide. Alternatively, an oxide semiconductor can be used for the semiconductor layer where a channel of the transistor 111 is formed.

In general, the electron affinity of silicon, germanium, or the like is lower than the work function of metal. Therefore, in the case where it is necessary to obtain an ohmic contact between the semiconductor layer including silicon or germanium, and the source electrode or the drain electrode, it is necessary to provide an ohmic contact layer therebetween. However, since the electron affinity of an oxide semiconductor is higher than that of silicon or germanium, an ohmic contact between the semiconductor layer including an oxide semiconductor, and the source electrode or the drain electrode can be obtained without an ohmic contact layer therebetween. For example, since the electron affinity of an In—Ga—Zn—O-based oxide semiconductor is about 4.3 eV, an ohmic contact between the semiconductor layer, and the source electrode or the drain electrode can be obtained without an ohmic contact layer in such a manner that an In—Ga—Zn—O-based oxide semiconductor is used for the semiconductor layer, and titanium which has a work function of about 4.1 eV, titanium nitride which has a work function of about 4.0 eV, or the like is used for the source electrode or the drain electrode connected to the semiconductor layer. With the use of an oxide semiconductor for the semiconductor layer, a manufacturing process of a semiconductor device can be simplified; thus, the productivity of the semiconductor device can be improved.

Note that an oxide semiconductor which is purified (purified OS) by supply of oxygen after reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor). Accordingly, a transistor including the oxide semiconductor in a semiconductor layer where a channel is formed has characteristics of very small off-state current.

Next, a configuration example of the pixel used in a liquid crystal display device will be described with reference to FIGS. 1A to 1C. Note that a liquid crystal layer, a counter electrode, and the like are omitted in FIGS. 1A to 1C. FIG. 1A is a top view illustrating the planar structure of the pixel 110, and FIG. 1B is a cross-sectional view illustrating the stacked-layer structure of a portion taken along the chain line A1-A2 of FIG. 1A. FIG. 1C is a cross-sectional view illustrating the stacked-layer structure of a portion taken along the chain line B1-B2 of FIG. 1A. Note that the transistor 111 illustrated in FIGS. 1A to 1C is a bottom-gate transistor in which a channel formation region is provided above a gate electrode.

In the cross section A1-A2 in FIG. 1B, an insulating layer 201 is formed over a substrate 200, and a gate electrode 202 and the wiring 203 are formed over the insulating layer 201. The insulating layer 201 functions as a base layer. Over the gate electrode 202, an insulating layer 204 functioning as a gate insulating layer, a semiconductor layer 205, and an insulating layer 214 and the insulating layer 215 each functioning as a channel protective layer are provided. In addition, the insulating layer 215 is formed so as to cover the side surfaces of the semiconductor layer 205 and also has a function of preventing entry of an impurity from the side surfaces of the semiconductor layer 205. Further, a planarization insulating layer 218 is formed over the insulating layer 215. Further, a pixel electrode 211b is formed over the planarization insulating layer 218, and electrically connected to the semiconductor layer 205 through contact holes 208 formed in the insulating layers 214 and 215 and the planarization insulating layer 218.

A source electrode 206a and a drain electrode 206b are formed over the pixel electrode 211b. The pixel electrode 211b is electrically connected to the source electrode 206a or the drain electrode 206b.

The wiring 203 functions as a capacitor electrode or a capacitor wiring. A portion where the wiring 203 and the pixel electrode 211b overlap with each other with the insulating layer 215 and the planarization insulating layer 218 provided therebetween functions as the capacitor 113. The insulating layer 215 and the planarization insulating layer 218 function as a dielectric layer of the capacitor 113.

Note that in the transistor 111, the drain electrode 206b is surrounded by the source electrode 206a that is U-shaped (or C-shaped, square-bracket-like shaped, or horseshoe-shaped). With such a shape, an enough channel width can be ensured even when the area of the transistor 111 is small, and accordingly, the amount of current flowing between the source and the drain at the time of conduction of the transistor (also referred to as the on-state current) can be increased.

If parasitic capacitance generated between the gate electrode 202 and the drain electrode 206b electrically connected to the pixel electrode 211b is large, the transistor is easily influenced by feedthrough, which may cause degradation in display quality because the potential supplied to the liquid crystal element 112 cannot be held accurately. With the structure in which the source electrode 206a is U-shaped and surrounds the drain electrode 206b, an enough channel width can be ensured and parasitic capacitance generated between the drain electrode 206b and the gate electrode 202 can be reduced. Therefore, the display quality of a display device can be improved.

Further, when one of the source electrode 206a and the drain electrode 206b or both are provided so that a channel formation region of the transistor 111 is covered as much as possible, one of the source electrode 206a and the drain electrode 206b or both can function as a light-blocking layer. Deterioration in characteristics of the transistor due to light irradiation can be prevented by providing the light-blocking layer so as to overlap with the channel formation region of the semiconductor layer.

In the cross section B1-B2 in FIG. 1C, the insulating layer 201 is formed over the substrate 200, and the wiring 212-i is formed over the insulating layer 201. The insulating layer 204 and the semiconductor layer 205 are formed over the wiring 212-i. The insulating layers 214 and 215 are formed over the semiconductor layer 205, and the planarization insulating layer 218 is formed over the insulating layer 215. An electrode 210 is formed over the planarization insulating layer 218, and the wiring 216-j is formed over the electrode 210.

By forming the insulating layers and the semiconductor layer described above between the wiring 216-j and the wiring 212-i, the distance in the film thickness direction between both the wirings can be increased; thus, parasitic capacitance in the intersection of the wiring 216-j and the wiring 212-i can be reduced. By reducing the parasitic capacitance in the intersection, delay of a signal supplied to the wiring 216-j and the wiring 212-i or distortion of the waveform can be reduced; thus, a display device with high display quality can be achieved.

Next, examples of the structures of the terminal 105 (one of m terminals 105) and the terminal 106 (one of n terminals 106) used in the semiconductor device 100 will be described with reference to FIGS. 7A1, 7A2, 7B1, and 7B2. Note that the terminal 107 can have a structure similar to that of the terminal 105 or the terminal 106. FIGS. 7A1 and 7A2 are a top view and a cross-sectional view, respectively, of the terminal 105. The chain line J1-J2 in FIG. 7A1 corresponds to a cross section J1-J2 in FIG. 7A2. FIGS. 7B1 and 7B2 are a top view and a cross-sectional view, respectively, of the terminal 106. The chain line K1-K2 in FIG. 7B1 corresponds to a cross section K1-K2 in FIG. 7B2. In the cross sections J1-J2 and K1-K2, J2 and K2 correspond to end portion sides of the substrate.

In the cross section J1-J2, the insulating layer 201 is formed over the substrate 200, and the wiring 212 is formed over the insulating layer 201. The insulating layer 215 is formed over the wiring 212. The planarization insulating layer 218 is formed over the insulating layer 215. An electrode 222 is formed over the planarization insulating layer 218, and the electrode 222 is electrically connected to the wiring 212 through a contact hole 219 formed in the planarization insulating layer 218. Further, an electrode 221 is formed over the electrode 222.

In the cross section K1-K2, the insulating layers 201 and 215 are formed over the substrate 200. The planarization insulating layer 218 and an electrode 223 are formed over the insulating layer 215, and the wiring 216 is formed over the electrode 223.

Next, a method for manufacturing the pixel 110 described with reference to FIGS. 1A to 1C, and a method for manufacturing the terminal 105 and the terminal 106 described with reference to FIGS. 7A1, 7A2, 7B1, and 7B2 will be described with reference to FIGS. 2A and 2B, FIGS. 3A to 3C, FIGS. 4A to 4C, and FIGS. 5A to 5C. Note that the cross sections A1-A2, J1-J2, and K1-K2 in FIGS. 2A and 2B, FIGS. 3A to 3C, FIGS. 4A to 4C, and FIGS. 5A to 5C are the cross-sectional views of the portions taken along the chain line A1-A2 of FIGS. 1A to 1C and the chain lines J1-J2 and K1-K2 of FIGS. 7A1, 7A2, 7B1, and 7B2.

As illustrated in FIG. 2A, first, the insulating layer 201 is formed over the substrate 200.

As the substrate 200, as well as a glass substrate or a ceramic substrate, a plastic substrate or the like having at least heat resistance to withstand subsequent heat treatment can be used. In the case where a substrate does not need a light-transmitting property, a metal substrate such as a stainless alloy substrate, whose surface is provided with an insulating layer, may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. Note that more practical glass with heat resistance can be obtained when it contains a larger amount of barium oxide (BaO) than diboron trioxide ($B_2O_3$). Therefore, a glass substrate containing BaO and $B_2O_3$ so that the amount of BaO is larger than that of $B_2O_3$ is preferably used.

The insulating layer 201 can be formed to have a single-layer structure or a stacked-layer structure using one or more of the following insulating layers: an aluminum oxide layer, an aluminum nitride layer, an aluminum oxynitride layer, a silicon oxide layer, a silicon nitride layer, a silicon nitride oxide layer, and a silicon oxynitride layer. The insulating layer 201 has a function of preventing diffusion of impurity elements from the substrate 200. Note that in this specification, silicon nitride oxide contains more nitrogen than oxygen and, in the case where measurements are performed using RBS and HFS, preferably contains oxygen, nitrogen, silicon, and hydrogen at concentrations of greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. The insulating layer 201 can be formed by a sputtering method, a molecular beam epitaxy (MBE) method, a CVD method, a pulse laser deposition method, an atomic layer deposition (ALD) method, a coating method, a printing method, or the like as appropriate. Note that the insulating layer 201 is formed to a thickness of greater than or equal to 50 nm and less than or equal to 300 nm, preferably greater than or equal to 100 nm and less than or equal to 200 nm.

Next, over the insulating layer 201, a conductive layer 231 is formed to a thickness of greater than or equal to 100 nm and less than or equal to 500 nm, preferably greater than or equal to 200 nm and less than or equal to 300 nm, by a sputtering method, a vacuum evaporation method, a plating method, or the like.

The conductive layer 231 can be formed to have a single-layer structure or a stacked-layer structure using a metal material such as molybdenum (Mo), titanium (Ti), tungsten (W), tantalum (Ta), aluminum (Al), copper (Cu), chromium (Cr), neodymium (Nd), scandium (Sc), or magnesium (Mg), or a material containing any of these elements as its main component. For example, the conductive layer 231 may be a stack of a Cu—Mg—Al alloy, and Cu or Al. By providing a Cu—Mg—Al alloy material in contact with the insulating layer 201, adhesion between the conductive layer 231 and the insulating layer 201 can be improved.

The conductive layer 231 is formed into an electrode or a wiring through a subsequent photolithography step; therefore, it is preferable to use Al or Cu which is a low-resistance material. When Al or Cu is used, delay of a signal or distortion of the waveform is reduced, so that a display device with high display quality can be obtained. Note that Al has low heat resistance; therefore, a defect due to a hillock, a whisker, or migration tends to be caused. In order to prevent migration of Al, it is preferable to employ a stacked-layer structure of Al and a metal material having a higher melting point than Al, such as Mo, Ti, or W, or a material containing any of these metal materials as its main component. Alternatively, as long as the conductive layer 231 is not formed using an insulator, an oxide or a nitride of the above materials may be stacked. In the case where a material containing Al is used for the conductive layer 231, the maximum process temperature in subsequent steps is preferably lower than or equal to 380° C., further preferably lower than or equal to 350° C.

Also when Cu is used for the conductive layer 231, in order to prevent a defect due to migration and diffusion of Cu elements, it is preferable to employ a stacked-layer structure of Cu and a metal material having a higher melting point than Cu, such as Mo, Ti, or W, or a material containing any of these metal materials as its main component. Alternatively, as long as the conductive layer 231 is not formed using an insulator, an oxide or a nitride of the above materials may be stacked. For example, the conductive layer 231 may be a stack of titanium nitride and Cu. In the case where a material containing Cu is used for the conductive layer 231, the maximum process temperature in subsequent steps is preferably lower than or equal to 450° C.

The thickness of the conductive layer 231 is preferably decided in consideration of the resistance of the conductive layer 231 used as a wiring and is therefore preferably greater than or equal to 100 nm and less than or equal to 500 nm.

Next, an insulating layer 232 functioning as a gate insulating layer is formed over the conductive layer 231. The insulating layer 232 can be formed using silicon oxide, silicon nitride, silicon oxynitride, silicon nitride oxide, aluminum oxide, aluminum nitride, aluminum oxynitride, aluminum nitride oxide, tantalum oxide, yttrium oxide, lanthanum oxide, hafnium oxide, hafnium silicate ($HfSi_xO_y$ ($x>0$, $y>0$)), or the like by a method similar to that for forming the insulating layer 201. The insulating layer 232 is not limited to a single layer, and a stack of different layers may be used. For example, the insulating layer 232 may be formed in the following manner: a silicon nitride ($SiN_y$ ($y>0$)) layer is formed by a plasma CVD method as an insulating layer A and a silicon oxide ($SiO_x$ ($x>0$)) layer is stacked over the insulating layer A as an insulating layer B.

Other than a sputtering method, a plasma CVD method, and the like, the insulating layer 232 can be formed by a film formation method such as a high-density plasma CVD method using microwaves (e.g., a frequency of 2.45 GHz).

The thickness of the insulating layer 232 is preferably decided in consideration of the leakage current or the withstand voltage and is therefore preferably greater than or equal to 50 nm and less than or equal to 300 nm, more preferably greater than or equal to 100 nm and less than or equal to 200 nm.

In the case where a stacked-layer structure is employed for the insulating layer 232, the insulating layer 232 may have a stacked-layer structure of a film formed using an insulating material containing the same kind of component as an oxide semiconductor and a film formed using a material different from that of the film.

Next, a semiconductor layer 233 is formed over the insulating layer 232. In the case where an oxide semiconductor is used for the semiconductor layer 233, the oxide semiconductor contains at least one element selected from In, Ga, Sn, and Zn. For example, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor; a Sn—O-based oxide semiconductor; a Zn—O-based oxide semiconductor; or the like may be used. In addition, any of the above oxide semiconductors may contain an element other than In, Ga, Sn, and Zn, for example, $SiO_2$.

Here, for example, the In—Ga—Zn—O-based oxide means an oxide semiconductor containing indium (In), gallium (Ga), and zinc (Zn) and there is no particular limitation on the composition ratio thereof. The In—Ga—Zn—O-based oxide semiconductor may contain an element other than In, Ga, and Zn.

As the oxide semiconductor, a thin film represented by the chemical formula, $InMO_3(ZnO)_m$ ($m>0$) can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 3:2 in an atomic ratio ($In_2O_3$:ZnO=15:2 to 3:4 in a molar ratio). For example, when a target used for forming the In—Zn—O-based oxide semiconductor has a composition ratio of In:Zn:O=X:Y:Z in an atomic ratio, $Z>1.5X+Y$ is satisfied.

An oxide semiconductor layer can be formed by applying any film formation method; however, it is preferable that a film formation method such as a sputtering method or a CVD method, which is performed in a state where an atmosphere is sufficiently managed, be employed. In order to reduce the hydrogen concentration in the oxide semiconductor layer, the oxide semiconductor layer may be formed with the substrate heated at 200° C. or higher.

In the case where a sputtering method is employed as a film formation method of the oxide semiconductor layer, the oxide semiconductor layer can be formed under a rare gas (typically, argon) atmosphere, an oxygen atmosphere, or a mixed atmosphere of a rare gas and oxygen.

As a target for forming the oxide semiconductor layer by a sputtering method, for example, a metal oxide target having a composition ratio of $In_2O_3$:$Ga_2O_3$:ZnO=1:1:1 [molar ratio] (In:Ga:Zn=1:1:0.5 [atomic ratio]) is used to form an In—Ga—Zn—O layer. Without limitation to the material and the composition of the above target, for example, a metal oxide target having a composition ratio of $In_2O_3$:$Ga_2O_3$:ZnO=1:1:2 [molar ratio] (In:Ga:Zn=1:1:1 [atomic ratio]) or $In_2O_3$:$Ga_2O_3$:ZnO=1:1:4 [molar ratio] (In:Ga:Zn=1:1:2 [atomic ratio]) may be used.

It is preferable that a high-purity gas from which impurities such as hydrogen, water, a hydroxyl group, or hydride are removed be used as a sputtering gas for the formation of the oxide semiconductor layer.

When the oxide semiconductor layer is formed, the substrate is held in a film formation chamber kept under a reduced pressure, and the temperature of the substrate temperature is higher than or equal to 100° C. and lower than or equal to 600° C., preferably higher than or equal to 300° C. and lower than or equal to 500° C. Note that in the case where Al is used for the conductive layer 231, the substrate temperature is lower than or equal to 380° C., preferably lower than or equal to 350° C. Alternatively, in the case where Cu is used for the conductive layer 231, the substrate temperature is lower than or equal to 450° C.

By heating the substrate during the film formation, the concentration of impurities such as hydrogen, moisture, hydride, or hydroxide in the formed oxide semiconductor layer can be reduced. In addition, damage by sputtering can be reduced. Then, a sputtering gas from which hydrogen and moisture are removed is introduced into the film formation chamber and moisture remaining therein is removed, and the oxide semiconductor layer is formed with the use of the above target.

In order to remove moisture remaining in the film formation chamber, an entrapment vacuum pump such as a cryopump, an ion pump, or a titanium sublimation pump is preferably used. As an evacuation unit, a turbo molecular pump provided with a cold trap may be used. In the film formation chamber which is evacuated with the cryopump, for example, a hydrogen atom, a compound containing a hydrogen atom such as water ($H_2O$), and a compound containing a carbon atom are removed, whereby the impurity concentration in the oxide semiconductor layer formed in the film formation chamber can be reduced.

An example of the film formation conditions is as follows: the distance between the substrate and the target is 100 mm; the pressure is 0.6 Pa, the direct current (DC) power source is 0.5 kW; and the atmosphere is an oxygen atmosphere (the proportion of the oxygen flow rate is 100%) is used. Note that a pulsed direct-current power source is preferably used, in which case powder substances (also referred to as particles or dust) that are generated in film formation can be reduced and the film thickness can be uniform.

Next, heat treatment may be performed, if necessary. After excessive hydrogen (including water and a hydroxyl group) in the oxide semiconductor layer is removed (dehydrated or dehydrogenated) by the heat treatment, the atomic structure in the oxide semiconductor layer can be ordered by supply of oxygen, and the defect levels in the energy gap can be reduced. In addition, defects at the interface between the oxide semiconductor layer and the insulating layer in contact with the oxide semiconductor layer can be reduced.

The heat treatment is preferably performed at a temperature higher than or equal to 250° C. and lower than or equal to 750° C. or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is lower than or equal to 20 ppm (the dew point: −55° C.), preferably lower than or equal to 1 ppm, further preferably lower than or equal to 10 ppb in the case where measurement is performed using a dew-point meter of a cavity ring-down laser spectroscopy (CRDS) system). Note that in the case where Al is used for a wiring layer formed through a first photolithography step, the heat treatment temperature is lower than or equal to 380° C., preferably lower than or equal to 350° C. Alternatively, in the case where Cu is used for the wiring layer formed through the first photolithography step, the heat treatment temperature is lower than or equal to 450° C.

Note that the heat treatment apparatus is not limited to the electrical furnace, and may include a device for heating a process object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a process object by heat treatment, such as nitrogen or a rare gas like argon, is used.

For example, as the heat treatment, GRTA may be performed as follows. The substrate is transferred and put in an inert gas heated to a high temperature, is heated for several minutes, and is transferred and taken out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or the rare gas which is introduced into a heat treatment apparatus be higher than or equal to 6N (99.9999%), preferably higher than or equal to 7N (99.99999%) (that is, the impurity concentration is lower than or equal to 1 ppm, preferably lower than or equal to 0.1 ppm).

Further, the heat treatment may be performed anytime after the oxide semiconductor layer is formed.

The thickness of the oxide semiconductor layer determines characteristics of the transistor. In general, with a thin oxide semiconductor layer, the threshold voltage of the transistor is positive. However, when the semiconductor layer is too thin, variation in characteristics is greatly increased. Thus, the thickness of the oxide semiconductor layer is preferably greater than or equal to 5 nm and less than or equal to 50 nm.

Next, an insulating layer 234 is formed over the semiconductor layer 233. The insulating layer 234 can be formed using a material and a method similar to those of the insulating layer 201 or the insulating layer 232.

In the case where an oxide semiconductor is used for the semiconductor layer 233, an insulator containing oxygen is preferably used for the insulating layer 234. The thickness of the insulating layer 234 is greater than or equal to 50 nm and less than or equal to 300 nm, preferably greater than or equal to 100 nm and less than or equal to 200 nm.

In order to remove remaining moisture from the film formation chamber at the time of formation of the insulating layer 234, an entrapment vacuum pump (e.g., a cryopump) is preferably used. When the insulating layer 234 is formed in the film formation chamber evacuated using a cryopump, the impurity concentration in the insulating layer 234 can be reduced. In addition, as an evacuation unit for removing moisture remaining in the chamber used for depositing the insulating layer 234, a turbo molecular pump provided with a cold trap may be used.

In such a manner, over the substrate 200, the insulating layer 201, the conductive layer 231 to be the gate electrode of the transistor, the insulating layer 232 to be the gate insulating layer of the transistor, the semiconductor layer 233 to be a channel layer of the transistor, and the insulating layer 234 to be a channel protective layer of the transistor are successively formed without exposure to the air, whereby the layers and interfaces thereof are prevented from being contaminated; thus, the characteristics and the reliability of the semiconductor device can be improved. Further, with the interface state kept clean, the characteristics and the reliability of the transistor can be improved.

Next, the first photolithography step using a first photomask is performed as illustrated in FIG. 2B. A resist mask 235 having a large thickness and a small thickness is formed over the insulating layer 234, using a multi-tone mask as the first photomask.

As illustrated in FIG. 3A, the conductive layer 231, the insulating layer 232, the semiconductor layer 233, and the insulating layer 234 are selectively etched using the resist mask 235 as a mask to form the gate electrode 202, the wiring 203, the wiring 212, the island-like insulating layer 204, the island-like semiconductor layer 205, and the island-like insulating layer 214.

For the etching of the conductive layer 231, the insulating layer 232, the semiconductor layer 233, and the insulating layer 234, one of dry etching and wet etching or both in combination may be used.

A gas containing chlorine (a chlorine-based gas such as chlorine ($Cl_2$), boron trichloride ($BCl_3$), silicon tetrachloride ($SiCl_4$), or carbon tetrachloride ($Cl_4$)) can be employed as an etching gas used for the dry etching.

As the dry etching, a parallel-plate reactive ion etching (RIE) method or an inductively coupled plasma (ICP) etching method can be used. Since the insulating layer 201 has a function of preventing diffusion of impurity elements from the substrate 200, for the above etching, etching conditions are preferably adjusted so as to etch the insulating layer 201 as little as possible. Note that the insulating layer 201 is preferably formed using a material which is hardly etched during the above etching.

Next, as illustrated in FIG. 3B, the resist mask 235 having a small thickness is removed and the resist mask 235 having a large thickness is downsized by oxygen plasma ashing or the like. Part of the island-like insulating layer 214 is exposed by downsizing the resist mask 235 having a large thickness.

Next, as illustrated in FIG. 3C, the island-like insulating layer 204, the island-like semiconductor layer 205, and the island-like insulating layer 214 are selectively etched using the remaining resist mask 235 as a mask. At this time, the side surfaces of the island-like insulating layer 204, the island-like semiconductor layer 205, and the island-like insulating layer 214 on each side are substantially aligned with one another, and each layer has a substantially similar shape when seen from the above. Part of the gate electrode 202 is exposed by selective etching of the island-like insulating layer 204, the island-like semiconductor layer 205, and the island-like insulating layer 214. In addition, part of the wirings 203 and 212 are also exposed.

Further, the end portions of the gate electrode 202 are projected outside the end portions of the island-like insulating layer 204, the island-like semiconductor layer 205, and the island-like insulating layer 214, whereby a step is suppressed and coverage with an insulating layer or a conductive layer which will be formed later can be improved. Note that the end portions of the gate electrode 202 are not necessarily projected outside the end portions of the island-like insulating layer 204, the island-like semiconductor layer 205, and the island-like insulating layer 214.

Deterioration in characteristics of the transistor due to light irradiation from the gate electrode 202 side can be prevented by providing the island-like semiconductor layer 205 so as to overlap with the gate electrode 202 and providing the island-like semiconductor layer 205 to be smaller than the gate electrode 202.

Note that in order to reduce parasitic capacitance in an intersection of the wiring 216 which will be formed later and the wiring 203 and an intersection of the wiring 216 and the wiring 212, the island-like insulating layer 204, the island-like semiconductor layer 205, and the island-like insulating layer 214 are left over the portions of the wiring 203 and the wiring 212, which correspond to the intersections. Note that an example of the intersections of the wirings where the parasitic capacitance is reduced is illustrated in the cross-sectional view of FIG. 1C taken along the chain line B1-B2 of FIG. 1A.

Then, the resist mask 235 is removed. By using the multi-tone mask in such a manner, a plurality of photolithography steps can be replaced with one photolithography step. Thus, the gate electrode 202 (wiring 203) and the island-like semiconductor layer 205 can be formed through one photolithography step using one multi-tone mask. Accordingly, the productivity of a semiconductor device can be improved.

Note that unless otherwise specified, a photolithography step in this specification includes a step of forming a resist mask, a step of etching a conductive layer, a semiconductor layer, or an insulating layer, and a step of separating the resist mask.

Here, a multi-tone mask will be described with reference to FIGS. 8A to 8D. A multi-tone mask can perform three levels of light exposure to obtain an exposed portion, a half-exposed portion, and an unexposed portion. A multi-tone mask is a mask through which light is transmitted to have a plurality of intensities. One-time light exposure and development process can form a resist mask with regions of plural thicknesses (typically, two kinds of thicknesses) to be formed. Thus, the number of light-exposure masks (photomasks) can be reduced by using a multi-tone mask.

Figure 8A:
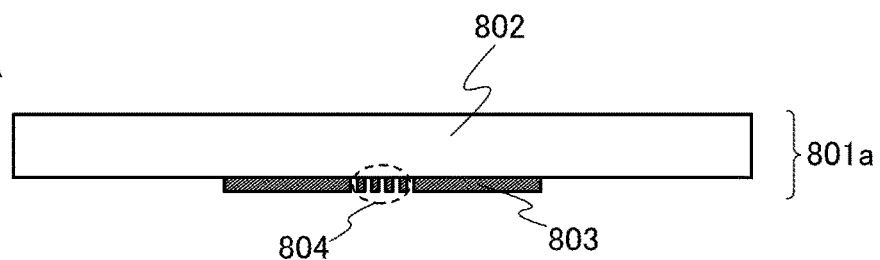
FIGS. 8A to 8D are diagrams describing examples of a multi-tone mask.
Figure 8B:
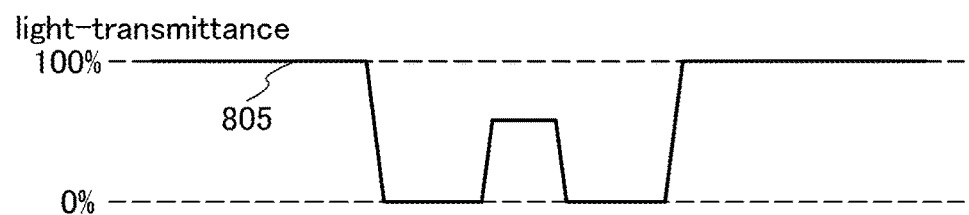
Figure 8C:
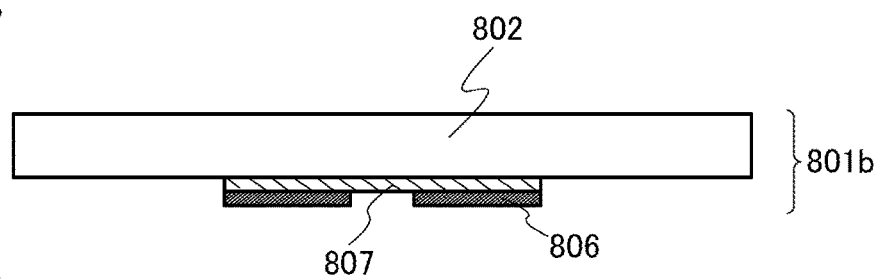

As typical examples of the multi-tone mask, a gray-tone mask 801a illustrated in FIG. 8A and a half-tone mask 801b illustrated in FIG. 8C are given.

As illustrated in FIG. 8A, the gray-tone mask 801a includes a light-transmitting substrate 802, and a light-blocking portion 803 and a diffraction grating 804 which are formed on the light-transmitting substrate 802. The light transmittance of the light-blocking portion 803 is 0%. On the other hand, the diffraction grating 804 has a light-transmitting portion in a slit form, a dot form, a mesh form, or the like with intervals which are equal to or less than the resolution limit of light used for the light exposure; thus, the light transmittance can be controlled. The diffraction grating 804 can have regularly-arranged slits, dots, or meshes, or irregularly-arranged slits, dots, or meshes.

As the light-transmitting substrate 802, a light-transmitting substrate such as a quartz substrate can be used. The light-blocking portion 803 and the diffraction grating 804 can be formed using a light-blocking material which absorbs light, such as chromium or chromium oxide.

When the gray-tone mask 801a is irradiated with light for exposure, a light transmittance 805 of the light-blocking portion 803 is 0% and the light transmittance 805 of a region where neither the light-blocking portion 803 nor the diffraction grating 804 is provided is 100%, as illustrated in FIG. 8B. The light transmittance of the diffraction grating 804 can be controlled in the range of from 10% to 70%. The light transmittance of the diffraction grating 804 can be controlled by adjusting the interval and pitch of slits, dots, or meshes of the diffraction grating.

As illustrated in FIG. 8C, the half-tone mask 801b includes the light-transmitting substrate 802, and a semi-light-transmitting portion 807 and a light-blocking portion 806 which are formed on the light-transmitting substrate 802. The semi-light-transmitting portion 807 can be formed using MoSiN, MoSi, MoSiO, MoSiON, CrSi, or the like. The light-blocking portion 806 can be formed using a light-blocking material which absorbs light, such as chromium or chromium oxide.

Figure 8D:
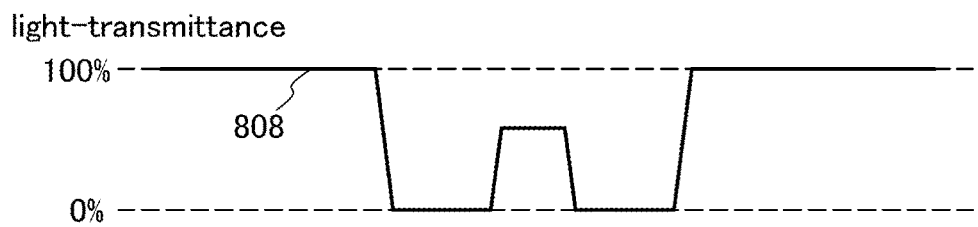

When the gray-tone mask 801b is irradiated with light for exposure, a light transmittance 808 of the light-blocking portion 806 is 0% and the light transmittance 808 of a region where neither the light-blocking portion 806 nor the semi-light-transmitting portion 807 is provided is 100%, as illustrated in FIG. 8D. The light transmittance of the semi-light-transmitting portion 807 can be controlled in the range of from 10% to 70%. The light transmittance of the semi-light-transmitting portion 807 can be controlled with the material of the semi-light-transmitting portion 807.

The resist mask 235 formed using a multi-tone mask is a resist mask including a plurality of regions (here, two regions) having different thicknesses; a region having a large thickness and a region having a small thickness. A region of the resist mask 235 having a large thickness is referred to as a projecting portion of the resist mask 235. A region of the resist mask 235 having a small thickness is referred to as a depressed portion of the resist mask 235.

Next, as illustrated in FIG. 4A, the insulating layer 215 is formed over the gate electrode 202, the island-like insulating layer 214, the wiring 203, and the wiring 212. The insulating layer 215 can be formed using a material and a method similar to those of the insulating layer 201, the insulating layer 232 (the island-like insulating layer 204), and the insulating layer 234 (the island-like insulating layer 214). Further, since the insulating layer 215 functions as a dielectric layer of the capacitor 113, a material having a high relative permittivity is preferably used. Note that although part of the gate electrode 202, the wiring 203, and the wiring 212 serving as a barrier layer are removed through the first photolithography step, the insulating layer 215 can function as a protective layer. The thickness of the insulating layer 215 is greater than or equal to 50 nm and less than or equal to 300 nm, preferably greater than or equal to 100 nm and less than or equal to 200 nm.

After that, the planarization insulating layer 218 is formed over the insulating layer 215. Further, since the planarization insulating layer 218 functions as a dielectric layer of the capacitor 113, a material having a high relative permittivity is preferably used.

Next, a second photolithography step using a second photomask is performed as illustrated in FIG. 4B. The contact holes 208 are formed by selective removal of the island-like insulating layer 214, the insulating layer 215, and the planarization insulating layer 218. Part of the island-like semiconductor layer 205 is exposed in the contact holes 208. In addition, the contact hole 219 is formed by selective removal of the insulating layer 215 and the planarization insulating layer 218. Part of the wiring 212 is exposed in the contact hole 219. Further, the areas of the contact holes are preferably increased or the number of contact holes is preferably increased as much as possible in order to reduce the contact resistance.

Next, as illustrated in FIG. 4C, a conductive layer 211 functioning as a pixel electrode is formed over the planarization insulating layer 218, an exposed portion of the island-like semiconductor layer 205, and an exposed portion of the wiring 212.

The conductive layer 211 functioning as a pixel electrode is preferably formed using a light-transmitting material. For the light-transmitting conductive material, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used. Alternatively, graphene may be used for the conductive layer 211.

Further, a conductive layer 224 is formed over the conductive layer 211 functioning as a pixel electrode. The conductive layer 224 is formed by a sputtering method, a vacuum evaporation method, a plating method, or the like in manner similar to that of the conductive layer 231. The thickness of the conductive layer 224 is preferably decided in consideration of the resistance of the conductive layer 224 used as a wiring and is therefore preferably greater than or equal to 100 nm and less than or equal to 500 nm, more preferably greater than or equal to 200 nm and less than or equal to 300 nm.

The conductive layer 224 can be formed using a metal material such as molybdenum (Mo), titanium (Ti), tungsten (W), tantalum (Ta), aluminum (Al), copper (Cu), chromium (Cr), neodymium (Nd), scandium (Sc), or magnesium (Mg), or a material containing any of these elements as its main component. It is more preferable to use a material containing aluminum (Al) or copper (Cu), which is a low-resistance material, for the conductive layer 224. With the use of aluminum (Al) or copper (Cu), wiring resistance can be reduced, signal delay can be prevented, and distortion of the waveform can be reduced.

Note that when Cu is used for the conductive layer 224 it is preferable to employ a stacked-layer structure of Cu and a metal material having a higher melting point than Cu, such as Mo, Ti, or W, or a material containing any of these metal materials as its main component. Alternatively, as long as the conductive layer 224 is not formed using an insulator, an oxide or a nitride of the above materials may be stacked. For example, the conductive layer 224 may be a stack of titanium nitride and Cu.

Next, a third photolithography step using a third photomask is performed as illustrated in FIG. 5A. A resist mask 238 having a large thickness and a small thickness is formed over the conductive layer 224, using a multi-tone mask as the third photomask. There is a region over the conductive layer 224, where the resist mask 238 is not formed and the conductive layer 224 is exposed.

The conductive layer 224 is selectively etched using the resist mask 238 as a mask, whereby part of the conductive layer 211 functioning as a pixel electrode is exposed. Subsequently, the resist mask 238 having a small thickness is removed, whereby part of the conductive layer 224 is exposed. In addition, the resist mask 238 having a large thickness is reduced in size and part of the resist mask 238 remains over the conductive layer 224.

After that, part of the exposed conductive layer 211 functioning as a pixel electrode is selectively etched using the remaining resist mask 238 as a mask. Accordingly, part of the planarization insulating layer 218 is exposed, and an electrode 211a, the pixel electrode 211b, and the electrode 222 are formed. In addition, part of the exposed conductive layer 224 is selectively etched, whereby part of the pixel electrode 211b is exposed.

As illustrated in FIG. 5B, the remaining resist mask 238 is further reduced in size, and the source electrode 206a, the drain electrode 206b, the electrode 221, the wiring 216, and the electrode 223 are formed. Then, as illustrated in FIG. 5C, the resist mask 238 is removed.

By using the multi-tone mask in such a manner, a plurality of photolithography steps can be replaced with one photolithography step. Thus, the source electrode 206a and the drain electrode 206b (the electrodes 221 and 222, the wiring 216, and the electrode 223) and the pixel electrode 211b can be formed through one photolithography step using one photomask. Accordingly, the productivity of a semiconductor device can be improved.

According to one embodiment of the present invention, a resist mask including a plurality of regions having different thicknesses is formed by utilizing the properties of a multi-tone mask, and photolithography steps are performed by utilizing a difference in thickness of the resist mask, whereby the number of photolithography steps and the number of photomasks which are used for manufacturing a transistor can be reduced to less than the conventional one.

As a result, a transistor can be manufactured using three photomasks by employing the above steps. The manufacturing process of a transistor functioning as a switching element of a pixel is simplified, whereby the manufacturing process of a liquid crystal display device can also be simplified.

An example of a liquid crystal display device including the transistor 111 and the capacitor 113 which are manufactured employing the above steps will be described with reference to FIGS. 9A and 9B. FIG. 9B is a cross-sectional view taken along the line M-N of FIG. 9A.

Figure 9A:
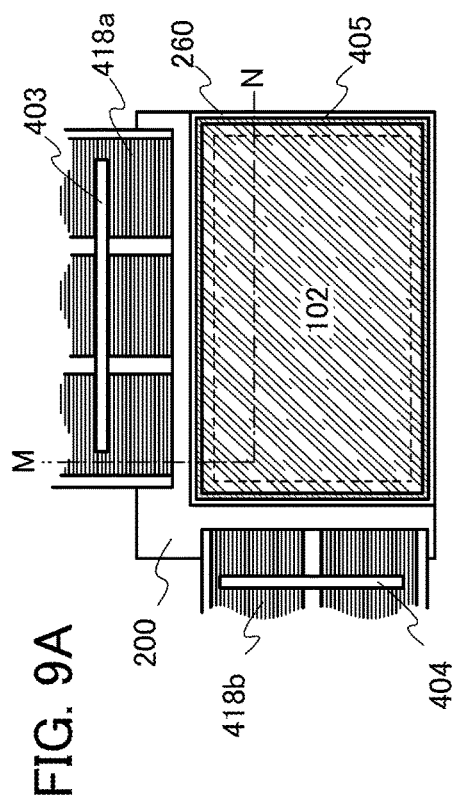
FIGS. 9A and 9B are a top view and a cross-sectional view, respectively, illustrating one embodiment of the present invention.
Figure 9B:
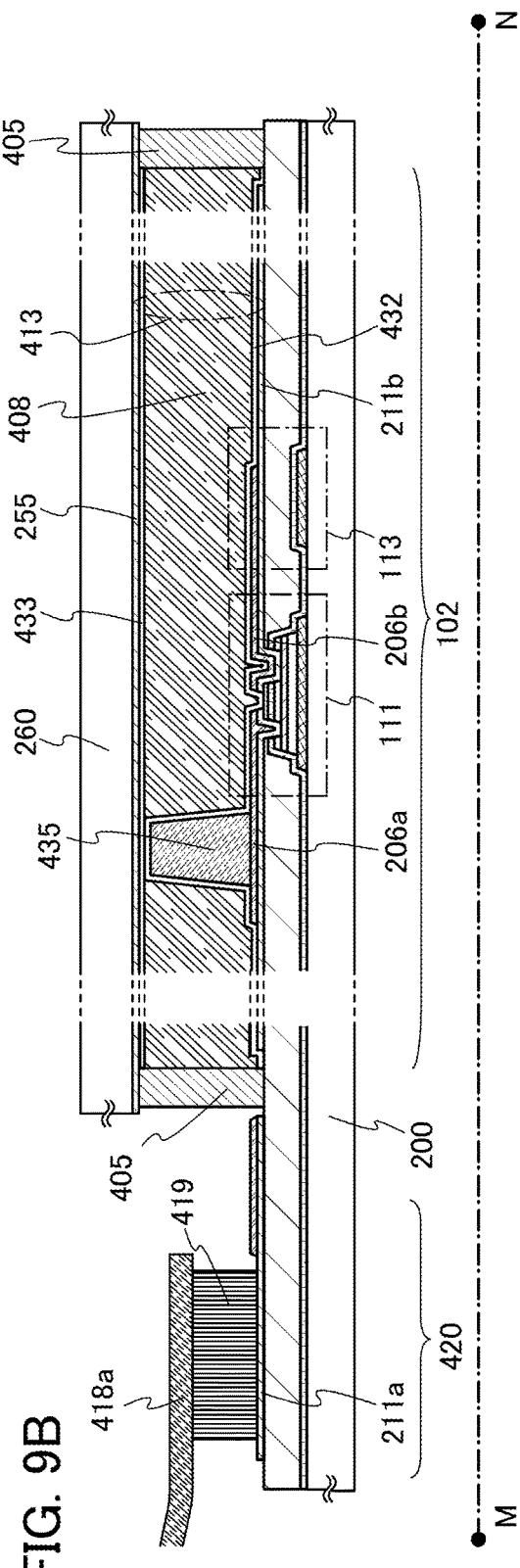

As illustrated in FIG. 9A, a sealant 405 is provided so as to surround a pixel region 102 provided over a first substrate 200, and the pixel region 102 is sealed between the first substrate 200 and a second substrate 260. In FIG. 9A, a scan line driver circuit 404 and a signal line driver circuit 403 which are formed using a single crystal semiconductor film or a polycrystalline semiconductor film over a substrate separately prepared are mounted in a region that is different from the region surrounded by the sealant 405 over the first substrate 200. Further, a variety of signals and potentials are supplied to the signal line driver circuit 403 which is formed separately, the scan line driver circuit 404, or the pixel region 102 from an FPC 418a and an FPC 418b.

In addition, the liquid crystal display device includes a panel in which a display element (a liquid crystal element) is sealed, and a module in which an IC or the like including a controller is mounted on the panel.

Note that a liquid crystal display device in this embodiment means an image display device, a display device, or a light source (including a lighting device). Further, the liquid crystal display device includes any of the following modules in its category: a module to which a connector such as a FPC, a TAB tape, or a TCP is attached; a module having a TAB tape or a TCP at the tip of which a printed wiring board is provided; and a module in which an integrated circuit (IC) is directly mounted on a display element by COG method.

As illustrated in FIG. 9B, a fourth photolithography step using a fourth photomask is performed, whereby a columnar spacer 435 is formed by selective etching of an insulating layer. The columnar spacer 435 is provided to control the thickness (cell gap) of a liquid crystal layer 408. The shape of the spacer may be spherical, and a photolithography step for forming a spacer is not necessary in the case of a spherical spacer.

Note that when the resist mask 238 is not removed completely as illustrated in FIG. 5C but is left as illustrated in FIG. 5B, the remaining resist mask 238 can also be used as a columnar spacer. In this case, resist removal is not necessarily performed and the fourth photolithography step using the fourth photomask is not necessarily performed. Therefore, the number of photolithography steps in manufacturing a liquid crystal display device can be reduced by one.

Further, a counter electrode 255 is formed on the second substrate 260. The counter electrode 255 is formed using the same conductive layer as the source electrode and the drain electrode of the transistor 111.

The liquid crystal display device includes an input terminal 420, and the electrode 211a is electrically connected to a terminal included in the FPC 418a through an anisotropic conductive film 419.

Figure 12A:
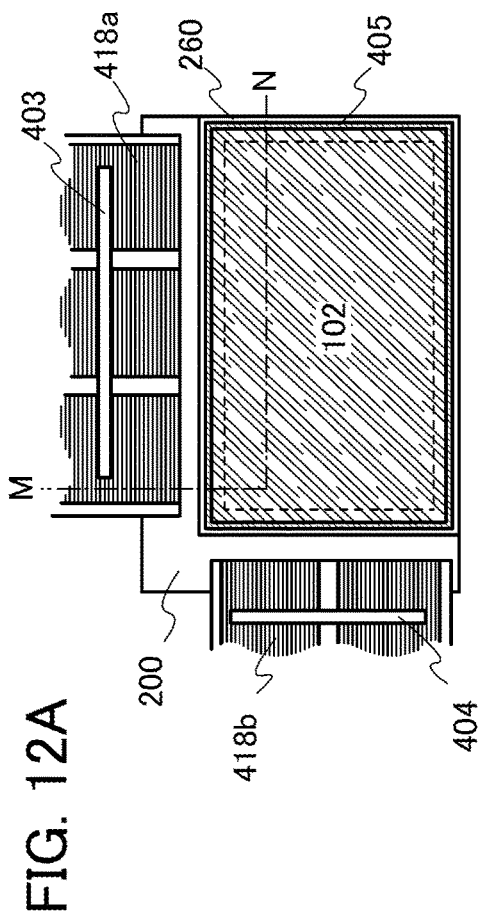
FIGS. 12A and 12B are a top view and a cross-sectional view, respectively, illustrating one embodiment of the present invention.
Figure 12B:
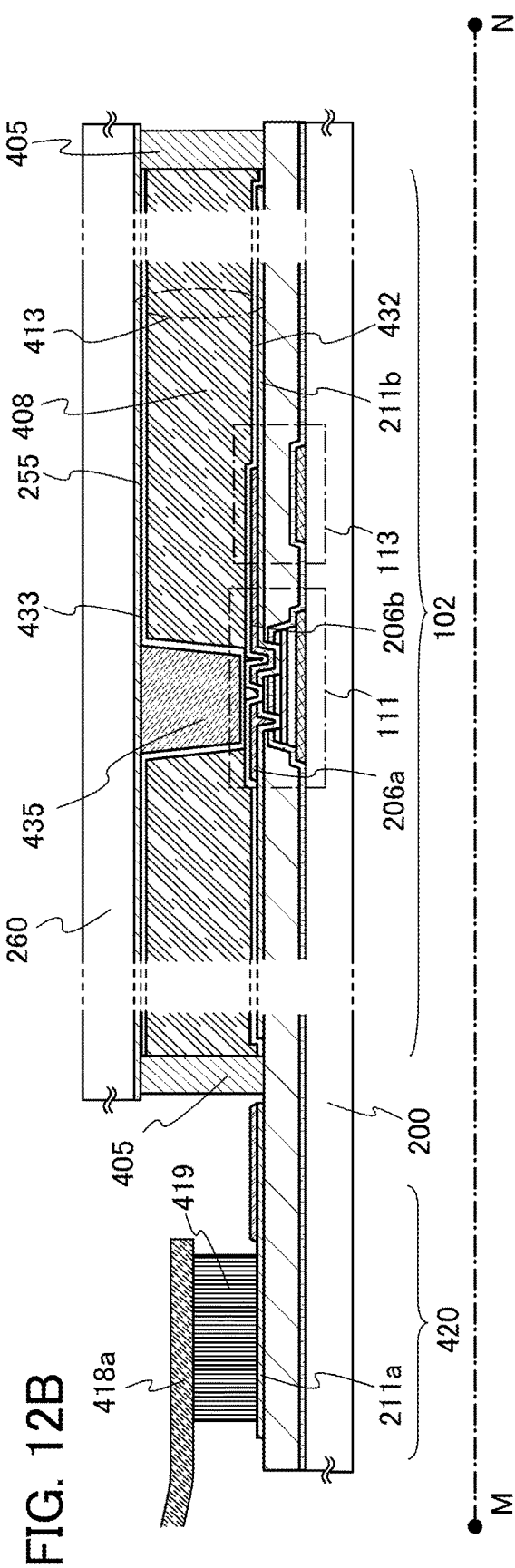

Note that as illustrated in FIGS. 12A and 12B, the counter electrode 255 is formed on the second substrate 260 and then an insulating layer is formed on the counter electrode 255 and a photolithography step using a new photomask is performed to selectively etch the insulating layer, whereby a columnar spacer 435 is formed. When a light-blocking material is used for the columnar spacer 435, the transistor can be shielded from light.

A liquid crystal element 413 which is a display element includes the pixel electrode 211b, the counter electrode 255 formed on the second substrate 260, and the liquid crystal layer 408. The pixel electrode 211b provided on the substrate 200 side and the counter electrode 255 provided on the second substrate 260 side are stacked with the liquid crystal layer 408 provided therebetween.

In addition, an insulating film 432 and an insulating film 433 each functioning as an alignment film are provided so that the liquid crystal layer 408 is provided therebetween. Note that in the case where a liquid crystal exhibiting a blue phase is used, the insulating films 432 and 433 each functioning as an alignment film are not necessarily provided.

As a material used for the liquid crystal element 413 which is a display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

The size of storage capacitor formed in the liquid crystal display device is set considering the leakage current of the transistor provided in the pixel portion or the like so that electric charge can be held for a predetermined period.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. Here, the vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer); an optical member (an optical substrate) such as a polarizing member, a retardation member, or an anti-reflection member; and the like are provided as appropriate. In particular, it is important to block light with a black matrix so that the oxide semiconductor layer of the transistor is not irradiated with light, in order to improve the reliability of the liquid crystal display device. In addition, circular polarization may be obtained by using a polarizing substrate and a retardation substrate. Further, a backlight, a side light, or the like may be used as a light source.

In addition, it is possible to employ a time-division display method (also called a field-sequential driving method) with the use of plural kinds of light-emitting diodes (LEDs) emitting different colors as a backlight. By employing a field-sequential driving method, color display can be performed without using a color filter.

As a display method in the pixel portion, a progressive method, an interlace method, or the like can be employed.

The liquid crystal display device can display color images when a color filter including coloring layers of three colors of R, G, and B which are color elements controlled in a pixel at the time of displaying color images is used. Further, color elements controlled in a pixel at the time of displaying color images are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The liquid crystal display device of this embodiment is not limited to a liquid crystal display device for color display, and this embodiment can also be applied to a liquid crystal display device for monochrome display.

The liquid crystal display device is formed by repeating photolithography steps. Thus, the number of used photomasks corresponds to the number of photolithography steps. As in this embodiment, the photolithography steps are performed by utilizing the properties of a multi-tone mask which can produce, at one light exposure, three states of light exposure: an exposed state, a half-exposed state, and an unexposed state. Accordingly, the number of photolithography steps and the number of photomasks which are used for manufacturing a liquid crystal display device can be reduced to less than the conventional one.

According to one embodiment of the present invention, the liquid crystal display device can be manufactured with, in total, three photomasks including a photomask for forming the spacer 435. Thus, the number of manufacturing steps of the liquid crystal display device can be reduced to less than the conventional one; accordingly, the liquid crystal display device can be provided at low cost with high productivity.

Even when the spacer 435 formed using a resist mask is removed and a new spacer is formed, a liquid crystal display device can be manufactured with four photomasks in total (in the case where a columnar spacer is formed over a substrate on a transistor side or on a substrate on a counter electrode side).

This embodiment can be implemented in appropriate combination with the other embodiments.

[Embodiment 2]

In this embodiment, an example of a pixel layout which is different from that of Embodiment 1 will be described with reference to FIGS. 13A and 13B.

Figure 13A:
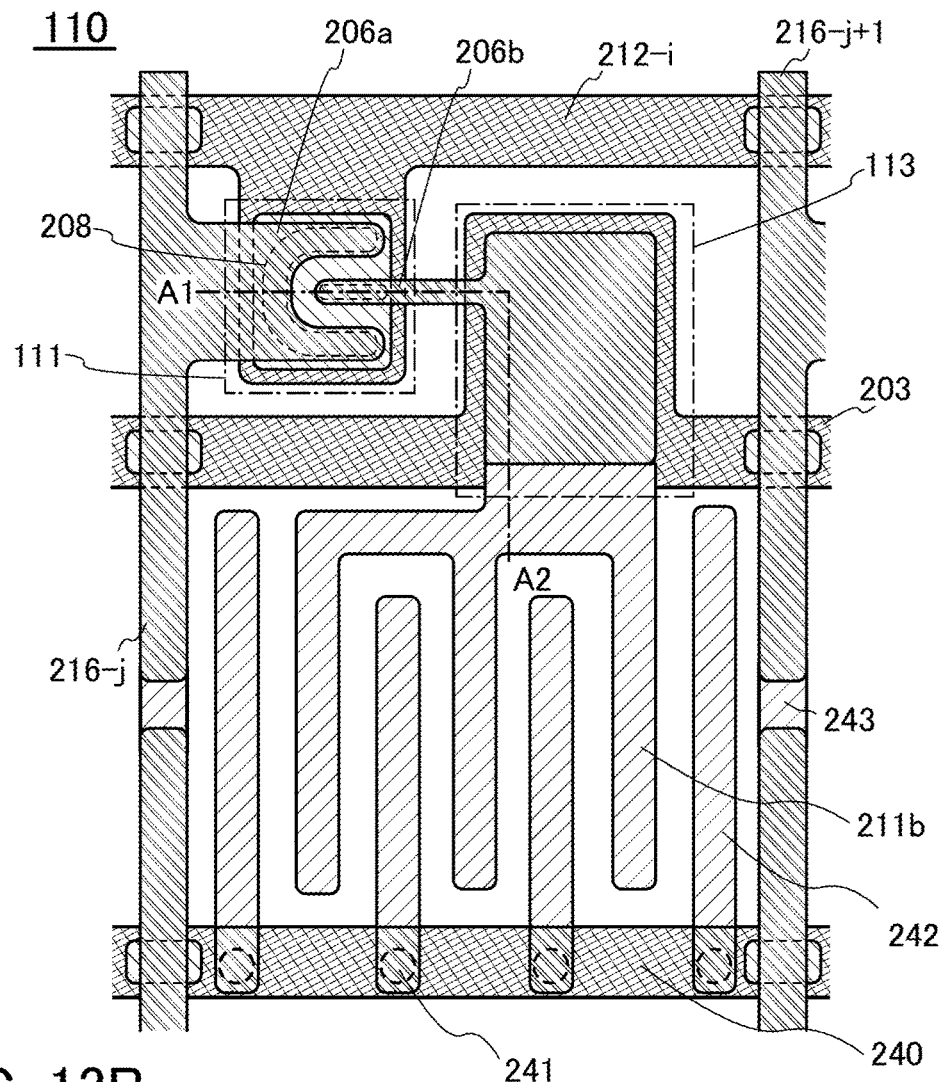
FIGS. 13A and 13B are a top view and a cross-sectional view, respectively, illustrating one embodiment of the present invention.
Figure 13B:
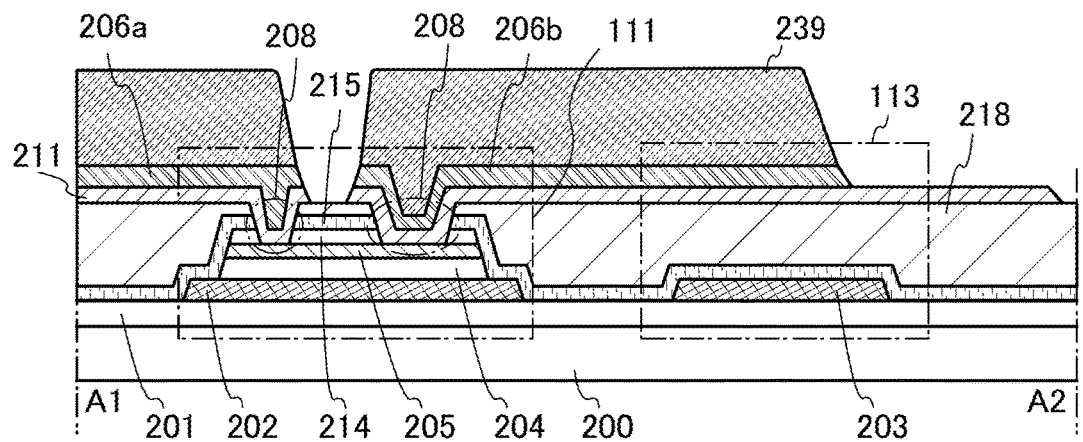

Note that this embodiment has many portions in common with Embodiment 1 except that the pixel layout is different; therefore, portions in FIGS. 13A and 13B, which are the same as those in FIGS. 1A to 1C, are denoted by the same reference numerals.

An IPS liquid crystal display device utilizing a horizontal electric field and a method for manufacturing the liquid crystal display device will be described below. A liquid crystal exhibiting a blue phase without an alignment film is used for the liquid crystal display device.

A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for a liquid crystal layer in order to improve the temperature range. The liquid crystal composition which includes a liquid crystal exhibiting a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the productivity of the liquid crystal display device can be increased.

The method for manufacturing the transistor 111 is almost the same as that in Embodiment 1; therefore, the detailed description is omitted here. In accordance with Embodiment 1, a first photolithography step using a first photomask is performed to form the insulating layer 215 over the gate electrode 202, the island-like insulating layer 214, and the wirings 203 and 212. Then, after the planarization insulating layer 218 is formed, a second photolithography step using a second photomask is performed to form the contact holes 208. Then, a conductive layer is formed and a metal layer is formed thereover. Then, a third photolithography step using a third photomask is performed to form the conductive layer 211 functioning as a pixel electrode and common electrodes 242. Note that multi-tone masks are used as the first photomask and the third photomask in a manner similar to that of Embodiment 1.

This embodiment differs from Embodiment 1 in that the pixel electrode 211b and the common electrodes 242 are formed over the same layer over one of substrates. A common wiring layer 240 is formed using the same material as the gate electrode 202.

In addition, the common electrodes 242 are formed through contact holes reaching the common wiring layer 240. The common electrodes 242 are formed using the same material as the pixel electrode 211b. The pixel electrode 211b has a comb-shape pattern. Further, metal layers 241 are formed over part of the common electrodes 242 overlapping with the contact holes.

In addition, in order to reduce the total number of photomasks, the resist mask used in the third photolithography step is left and used as a spacer 239. In the case of this embodiment, the resist mask remains also over a source wiring layer, and a region 243 where part of the source wiring layer is etched is formed so that a space between a pair of substrates is filled with a liquid crystal material. In the region 243, only a metal layer of the stack is etched, and only a layer formed using the same material as the conductive layer 211 functioning as a pixel electrode functions as part of the source wiring layer. Accordingly, a liquid crystal material is sealed uniformly through the region 243 when the space between the pair of substrates is filled with the liquid crystal.

According to one embodiment of the present invention, an IPS liquid crystal display device can be manufactured with, in total, three photomasks including a photomask for forming the spacer 239. Thus, the number of manufacturing steps of the liquid crystal display device can be reduced; accordingly, the liquid crystal display device can be provided at low cost with high productivity.

Even when the spacer 239 is removed and a new spacer is formed, an IPS liquid crystal display device can be manufactured with four photomasks in total (in the case where a columnar spacer is formed over a substrate on a transistor side).

Further, with the use of a liquid crystal exhibiting a blue phase without an alignment film, the number of the manufacturing steps of the liquid crystal display device can be further reduced.

It is needless to say that the pixel layout described in this embodiment is one example and there is no particular limitation on the pixel layout of FIG. 13A This embodiment can be implemented in appropriate combination with the other embodiments.

[Embodiment 3]

Figure 10A:
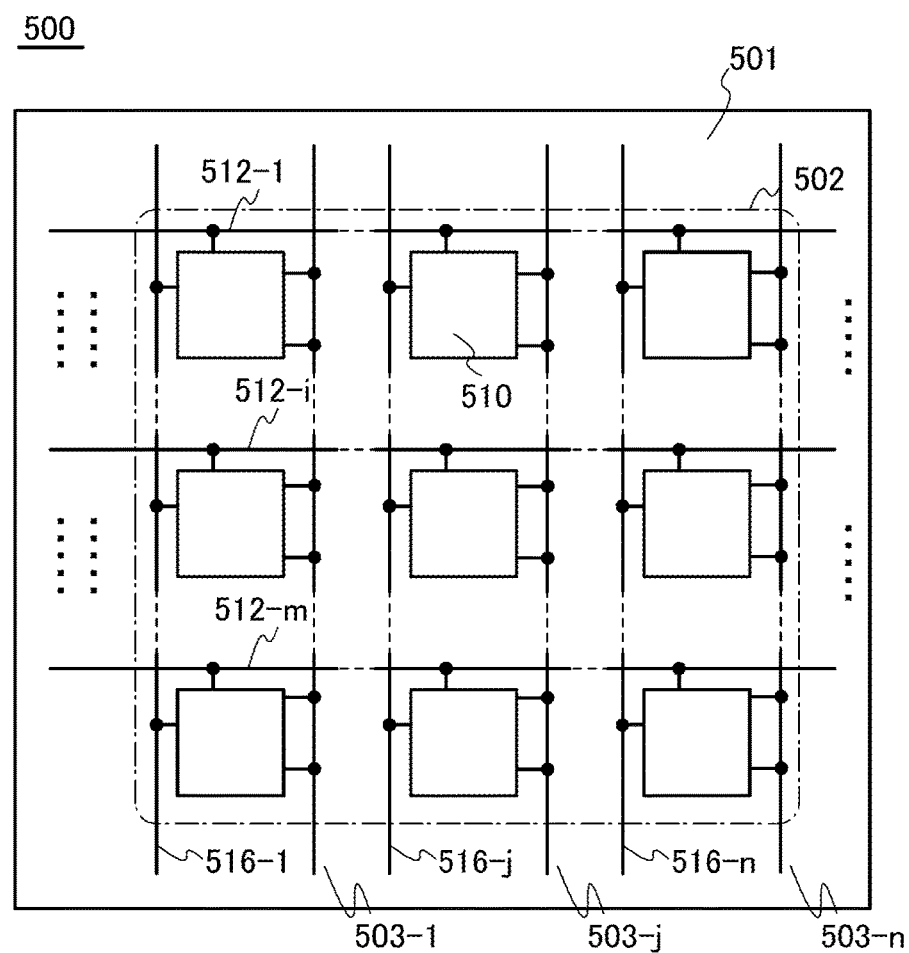
FIGS. 10A and 10B are circuit diagrams illustrating one embodiment of the present invention.

In this embodiment, an example of a semiconductor device manufactured by a smaller number of photomasks and photolithography steps, which is used for a light-emitting display device; a configuration example of a pixel; and an example of a method for manufacturing a pixel will be described with reference to FIGS. 10A and 10B and FIG. 11.

A semiconductor device that is used for a light-emitting display device will be described with reference to FIGS. 10A and 10B. FIG. 10A illustrates a configuration example of a semiconductor device 500 that is used in a light-emitting display device. The semiconductor device 500 includes, over a substrate 501, a pixel region 502, m wirings 512, n wirings 516, and n power supply lines 503 extending parallel to the wirings 516. The pixel region 502 includes a plurality of pixels 510 arranged in matrix of m rows (in the longitudinal direction)×n columns (in the transverse direction). The pixel 510 (i,j) (i is an integer greater than or equal to 1 and less than or equal to m, and j is an integer greater than or equal to 1 and less than or equal to n) in the i-th row and the j-th column is electrically connected to a wiring 512-i, a wiring 516-j, and a power supply line 503-j.

A variety of signals and potentials which are supplied from an external scan line driver circuit and an external signal line driver circuit are supplied to the wirings 512 and 516 through a flexible printed circuit (FPC).

Figure 10B:
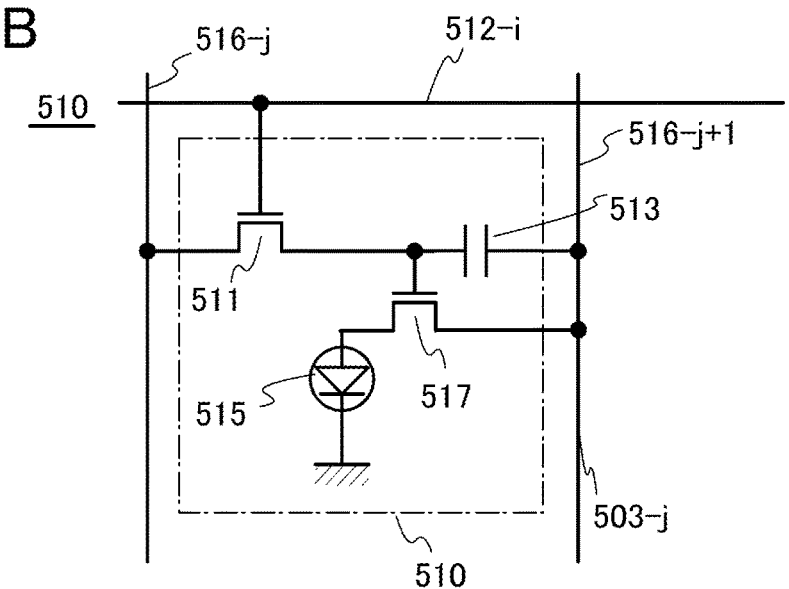

FIG. 10B illustrates a configuration example of the pixel 510 used in the semiconductor device 500. The pixel 510 includes a transistor 511, a transistor 517, a light-emitting element 515, and a capacitor 513.

A gate electrode of the transistor 511 is electrically connected to the wiring 512-i, and one of a source electrode and a drain electrode of the transistor 511 is electrically connected to the wiring 516-j. The other of the source electrode and the drain electrode of the transistor 511 is electrically connected to one electrode of the capacitor 513 and a gate electrode of the transistor 517. One of a source electrode and a drain electrode of the transistor 517 is electrically connected to one electrode of the light-emitting element 515. The other electrode of the capacitor 513 and the other of the source electrode and the drain electrode of the transistor 517 are electrically connected to the power supply line 503-j. The potential of the other electrode of the light-emitting element 515 is a fixed potential such as 0 V, GND, or a common potential.

The transistor 511 functions as a switching element. The transistor 517 has a function of supplying driving current to the light-emitting element 515 through the power supply line 503. The capacitor 513 functions as a storage capacitor. Note that one pixel 510 that is used in the semiconductor device 500 is provided with a plurality of transistors (at least two transistors). For example, a gate of one transistor is electrically connected to a drain or a source of another transistor. In a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. That is, a light-emitting element is a current injection type element; therefore, a light-emitting display device is operated by current driving and needs a transistor for supplying driving current.

For a semiconductor layer where a channel of the transistors 511 and 517 are formed, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide. Alternatively, an oxide semiconductor can be used for the semiconductor layer where a channel of the transistors 511 and 517 are formed.

In general, the electron affinity of silicon, germanium, or the like is lower than the work function of metal. Therefore, in the case where it is necessary to obtain an ohmic contact between the semiconductor layer including silicon or germanium, and the source electrode or the drain electrode, it is necessary to provide an ohmic contact layer therebetween.

However, since the electron affinity of an oxide semiconductor is higher than that of silicon or germanium, an ohmic contact between the semiconductor layer including an oxide semiconductor, and the source electrode or the drain electrode can be obtained without an ohmic contact layer therebetween. For example, since the electron affinity of an In—Ga—Zn—O-based oxide semiconductor is about 4.3 eV, an ohmic contact between the semiconductor layer, and the source electrode or the drain electrode can be obtained without an ohmic contact layer in such a manner that an In—Ga—Zn—O-based oxide semiconductor is used for the semiconductor layer, and titanium which has a work function of about 4.1 eV, titanium nitride which has a work function of about 4.0 eV, or the like is used for the source electrode or the drain electrode connected to the semiconductor layer. With the use of an oxide semiconductor for the semiconductor layer, a manufacturing process of a semiconductor device can be simplified; thus, the productivity of the semiconductor device can be improved.

Note that an oxide semiconductor which is purified (purified OS) by supply of oxygen after reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor). Accordingly, a transistor including the oxide semiconductor in a semiconductor layer where a channel is formed has characteristics of very small off-state current.

Next, a configuration example of the pixel used in a light-emitting display device will be described with reference to FIG. 11. FIG. 11 is a cross-sectional view. Note that the transistors 511 and 517 illustrated in FIG. 11 are bottom-gate transistors in which a channel formation region is provided above a gate electrode.

Figure 11:
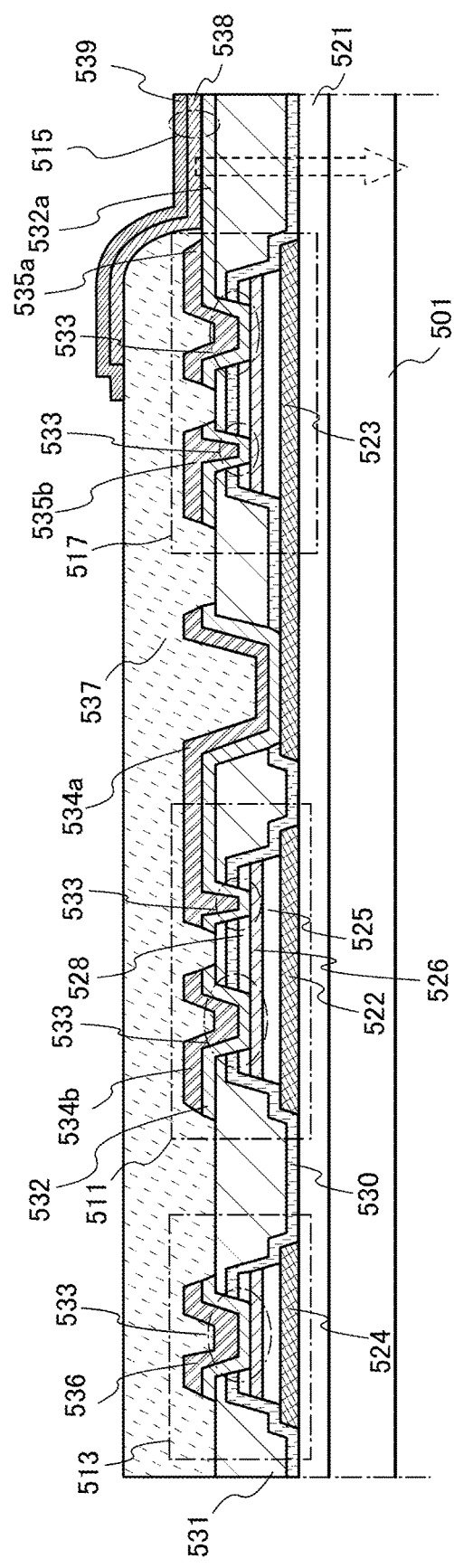
FIG. 11 is a cross-sectional view illustrating one embodiment of the present invention.

In the cross section in FIG. 11, an insulating layer 521 is formed over a substrate 501, and a gate electrode 522, a gate electrode 523, and a wiring 524 are formed over the insulating layer 521. The insulating layer 521 functions as a base layer. Over the gate electrodes 522 and 523 and the wiring 524, an insulating layer 525 functioning as a gate insulating layer, a semiconductor layer 526, and an insulating layer 528 functioning as a channel protective layer are provided. In addition, an insulating layer 530 is formed so as to cover the side surfaces of the semiconductor layer 526 and also has a function of preventing entry of an impurity from the side surfaces of the semiconductor layer 526. Further, a planarization insulating layer 531 is formed over the insulating layer 530. Further, a conductive layer 532 functioning as a pixel electrode is formed over the planarization insulating layer 531, and electrically connected to the semiconductor layer 526 through contact holes 533 formed in the insulating layers 528 and 530 and the planarization insulating layer 531.

In addition, a source electrode 534a and a drain electrode 534b, a source electrode 535a and a drain electrode 535b, and an electrode 536 are formed over the conductive layer 532 functioning as a pixel electrode, and the source electrode 534a and the drain electrode 534b, the source electrode 535a and the drain electrode 535b, and the electrode 536 are electrically connected to the conductive layer 532 functioning as a pixel electrode.

The wiring 524 functions as a capacitor electrode or a capacitor wiring. A portion where the wiring 524, and the conductive layer 532 functioning as a pixel electrode and the electrode 536 overlap with each other with the insulating layer 525 provided therebetween functions as the capacitor 513. The insulating layer 525 functions as a dielectric layer of the capacitor 513.

The light-emitting element 515 includes a pixel electrode 532a, a cathode 539, and a light-emitting layer 538. Note that the light-emitting intensity of the light-emitting layer 538 varies depending on the amount of supplied driving current.

In addition, a partition wall 537 is formed in the layer under the light-emitting layer 538 where the pixel electrode 532a does not exist to insulate each pixel 510 in the pixel region.

As a material for forming the pixel electrode 532a, a light-transmitting conductive material is preferably used. For the light-transmitting conductive material, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like can be used.

As a material for forming the cathode 539, a metal having a low work function can be used. Specifically, a metal material having high light-transmitting property such as aluminum (Al), magnesium (Mg), or barium (Ba) can be used.

As a material for forming the partition wall 537, a material having a high insulating property is preferably used. Specifically, an organic resin layer, an inorganic insulating layer, organopolysiloxane, or the like can be used. When a positive photosensitive organic resin is used as a material for forming the partition wall 537, a desired shape of the partition wall can be obtained by performing light exposure and development without a resist mask.

Next, an example of a method for manufacturing the pixel used in a light-emitting display device will be described. Note that the method for manufacturing the transistors 511 and 517 is almost the same as the method for manufacturing the transistor 111 in Embodiment 1; therefore, the detailed description is omitted here. In accordance with Embodiment 1, a first photolithography step using a first photomask is performed to form the gate electrodes 522 and 523, the wiring 524, and the semiconductor layer 526. Then, after the planarization insulating layer 531 is formed, a second photolithography step using a second photomask is performed to form the contact holes 533. Then, a third photolithography step using a third photomask is performed to form the pixel electrode 532a, the source electrode 534a and the drain electrode 534b, the source electrode 535a and the drain electrode 535b, and the electrode 536. Note that multi-tone masks are used as the first photomask and the third photomask in a manner similar to that of Embodiment 1.

This embodiment differs from Embodiment 1 in that a plurality of transistors is formed in one pixel and contact holes for electrically connecting the plurality of transistors are formed. According to one embodiment of the present invention, even when the number of transistors and the number of contact holes are increased, the transistors and the contact holes can be formed without increasing the number of photomasks. As a result, the transistors can be manufactured using three photomasks.

Next, a fourth photolithography step using a fourth photomask is performed to form the partition wall 537 for insulating the adjacent pixel electrodes 532a and form the light-emitting layer 538 and the cathode 539 over the pixel electrode 532a. Then, if necessary, sealing is performed to improve the reliability of the light-emitting display device. For example, with the use of a glass substrate as a sealing substrate, the sealing substrate and the substrate 501 are attached to each other with a sealant, and a dry agent is placed in the closed space formed by the substrate 501, the sealing substrate, and the sealant.

According to one embodiment of the present invention, the light-emitting display device can be manufactured with four photomasks in total. Thus, the number of manufacturing steps of the light-emitting display device can be reduced; accordingly, the light-emitting display device can be provided at low cost with high productivity.

Note that although an example of a bottom-emission light-emitting display device is illustrated in FIG. 11, there is no particular limitation. With the use of a light-transmitting material as the material of the cathode 539, a top-emission light-emitting display device can also be manufactured.

This embodiment can be implemented in appropriate combination with the other embodiments.

This application is based on Japanese Patent Application Serial No. 2011-011159 filed with Japan Patent Office on Jan. 21, 2011, the entire contents of which are hereby incorporated by reference.

What is claimed is:

1. A display device comprising: a substrate; a first conductive film over the substrate; a first insulating film over the first conductive film; an oxide semiconductor film over the first insulating film; a second insulating film over the oxide semiconductor film; a source wiring on and in contact with the second insulating film and electrically connected to the oxide semiconductor film through a first contact hole in the second insulating film; a common electrode over the second insulating film; a pixel electrode on and in contact with the second insulating film and electrically connected to the oxide semiconductor film through a second contact hole in the second insulating film; wherein the pixel electrode and the common electrode are formed over the same layer, wherein the pixel electrode has comb-shaped portions, wherein the first conductive film overlaps the first contact hole, wherein the first conductive film overlaps the second contact hole, and wherein the pixel electrode has a stacked-layer structure; a counter electrode over the pixel electrode.

2. The display device according to claim 1, wherein the common electrode has a light-transmitting property.

3. The display device according to claim 1, wherein the common electrode has a stacked-layer structure.

4. The display device according to claim 1, wherein the oxide semiconductor film contains indium, gallium, and zinc.

5. A display device comprising:
a substrate;
a first conductive film over the substrate;
a first insulating film over the first conductive film;
an oxide semiconductor film over the first insulating film;

a second insulating film over the oxide semiconductor film;

a source wiring on and in contact with the second insulating film and electrically connected to the oxide semiconductor film through a first contact hole in the second insulating film;

a common electrode over the second insulating film;

a pixel electrode on and in contact with the second insulating film and electrically connected to the oxide semiconductor film through a second contact hole in the second insulating film;

a capacitor electrically connected to the pixel electrode;

wherein the pixel electrode and the common electrode are formed over the same layer, wherein the first conductive film overlaps the first contact hole, wherein the first conductive film overlaps the second contact hole, and wherein the pixel electrode has comb-shaped portions.

6. The display device according to claim 5, wherein the common electrode has a light-transmitting property.

7. The display device according to claim 5, wherein the common electrode and has the pixel electrode have a same stacked-layer structure.

8. The display device according to claim 5, wherein the oxide semiconductor film contains indium, gallium, and zinc.

9. The display device according to claim 1, wherein the first insulating film is on and in contact with the first conductive film.

10. The display device according to claim 1, further comprising a third insulating film,
  wherein the third insulating film is on and in contact with a side surface of the first conductive film.

11. The display device according to claim 1, further comprising a third insulating film,
  wherein the third insulating film is on and in contact with a top surface of the first conductive film.

12. The display device according to claim 1, further comprising a third insulating film,
  wherein the third insulating film is on and in contact with a side surface of the oxide semiconductor film.

13. The display device according to claim 5, wherein the first insulating film is on and in contact with the first conductive film.

14. The display device according to claim 5, further comprising a third insulating film,
  wherein the third insulating film is on and in contact with a side surface of the first conductive film.

15. The display device according to claim 5, further comprising a third insulating film,
  wherein the third insulating film is on and in contact with a top surface of the first conductive film.

16. The display device according to claim 5, further comprising a third insulating film,
  wherein the third insulating film is on and in contact with a side surface of the oxide semiconductor film.

* * * * *